United States Patent
Mack et al.

(10) Patent No.: US 9,197,274 B2
(45) Date of Patent: Nov. 24, 2015

(54) ELASTOMERIC CHASSIS SUSPENSION FOR ELECTRONIC DEVICES

(71) Applicant: Qwest Communications International Inc., Denver, CO (US)

(72) Inventors: Adam Mack, Menlo Park, CA (US); James Yurchenco, Palo Alto, CA (US); Matthew Robert Adams, Mountain View, CA (US); Andrew Switky, Menlo Park, CA (US)

(73) Assignee: Qwest Communications International Inc., Denver, CO (US)

( * ) Notice: Subject to any disclaimer, the term of this patent is extended or adjusted under 35 U.S.C. 154(b) by 406 days.

(21) Appl. No.: 13/722,896

(22) Filed: Dec. 20, 2012

(65) Prior Publication Data

US 2013/0163159 A1   Jun. 27, 2013

Related U.S. Application Data

(60) Provisional application No. 61/579,880, filed on Dec. 23, 2011.

(51) Int. Cl.
| | | |
|---|---|---|
| *G06F 1/16* | (2006.01) | |
| *H04B 1/3888* | (2015.01) | |
| *H04M 1/18* | (2006.01) | |

(52) U.S. Cl.
CPC ............ *H04B 1/3888* (2013.01); *G06F 1/1656* (2013.01); *H04M 1/185* (2013.01); *G06F 2200/1633* (2013.01)

(58) Field of Classification Search
CPC ................ G06F 1/1656; G06F 1/1633; G06F 2200/1633; H01H 9/04; H01H 2009/048
USPC .................................................... 361/679.36
See application file for complete search history.

(56) References Cited

U.S. PATENT DOCUMENTS

| | | | | | |
|---|---|---|---|---|---|
| 5,373,458 | A | * | 12/1994 | Bishay et al. | 361/679.56 |
| 5,524,908 | A | * | 6/1996 | Reis | 277/654 |
| 5,844,772 | A | * | 12/1998 | Lee et al. | 361/679.26 |
| 6,305,908 | B1 | * | 10/2001 | Hermann et al. | 417/234 |
| 6,454,250 | B1 | * | 9/2002 | Ribeiro | 267/141 |
| 6,721,651 | B1 | * | 4/2004 | Minelli | 701/538 |
| 2003/0048597 | A1 | * | 3/2003 | Wang et al. | 361/681 |
| 2005/0236171 | A1 | * | 10/2005 | Garcia | 174/35 GC |
| 2009/0219684 | A1 | * | 9/2009 | Mori | 361/679.56 |

(Continued)

OTHER PUBLICATIONS

U.S. Appl. No. 13/722,884, filed Dec. 20, 2012, 41 pages.

*Primary Examiner* — Anthony Q Edwards
(74) *Attorney, Agent, or Firm* — Swanson & Bratschun, L.L.C.

(57) ABSTRACT

Novel tools and techniques are described for protecting an electronic device. In one aspect, an electronic device might comprise a housing defining an open front face, a chassis disposed within the housing, a panel disposed within the open front face of the housing and supported on the chassis, and an elastomeric overmold surrounding at least a portion of a perimeter of the panel and disposed between at least a portion of the chassis and at least a portion of the housing. In some cases, the overmold might be configured to provide a perimeter seal around the panel and to deform upon a frontal impact to the panel or housing. The overmold might be configured to prevent intrusion of liquids or particulates within the electronic device. In another aspect, a protective housing, which might comprise the housing, the chassis, and the overmold, may be provided for protecting a stand-alone electronic device.

17 Claims, 11 Drawing Sheets

(56) References Cited

U.S. PATENT DOCUMENTS

2011/0005798 A1* 1/2011 Moskowitz et al. ............ 174/50
2011/0090632 A1* 4/2011 Raff et al. ................ 361/679.27
2011/0276885 A1 11/2011 Gibson et al.
2012/0099266 A1* 4/2012 Reber et al. .............. 361/679.26

* cited by examiner

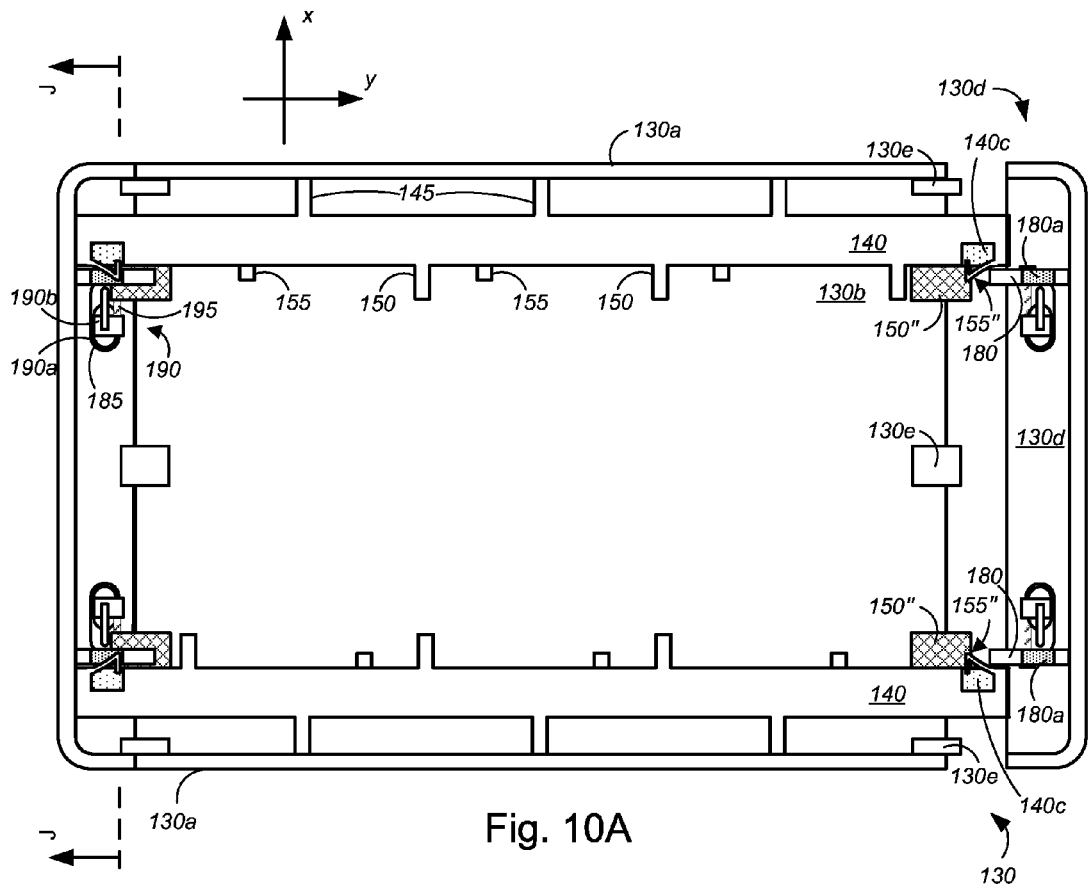
Fig. 10A
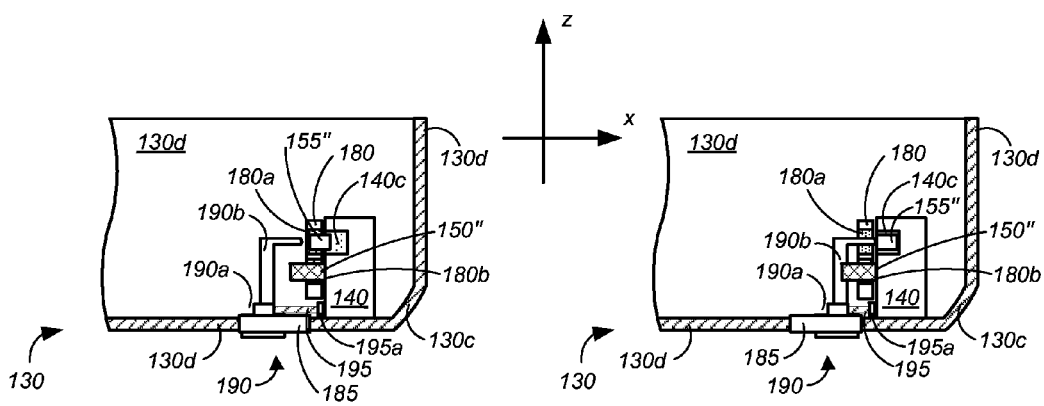
Fig. 10B
Fig. 10C

ELASTOMERIC CHASSIS SUSPENSION FOR ELECTRONIC DEVICES

CROSS-REFERENCES TO RELATED APPLICATIONS

This application claims priority to co-pending U.S. Provisional Patent Application No. 61/579,880, filed Dec. 23, 2011, by Mack et al. and titled, "ELASTOMERIC CHASSIS SUSPENSION FOR ELECTRONIC DEVICES", which is hereby incorporated by reference, as if set forth in full in this document, for all purposes.

The present disclosure may also be related to the following commonly assigned application(s)/patent(s):

U.S. patent application Ser. No. 12/773,742, filed May 4, 2010 by Gibson et al. and titled, "Multi-Client Local Network Base Station" (published as US PG Pub. No. 2011/0276885 A1 on Nov. 10, 2011) (hereinafter, the "'742 Application"), which is incorporated herein by reference in its entirety; and U.S. patent application Ser. No. 13/722,884 filed on a date even herewith by Mack et al. and titled "Camera Barrel Mechanism", which claims priority to provisional U.S. Patent Application No. 61/579,863, filed on Dec. 23, 2011, both of which are incorporated by reference herein in their entirety.

The respective disclosures of these applications/patents are incorporated herein by reference in their entirety for all purposes.

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to mechanisms for protecting components within and on a surface of portable electronic devices, and more particularly, to an elastomeric chassis suspension for electronic devices.

BACKGROUND

Traditionally, electronic devices, particularly portable electronic devices, have been constructed to be as compact as the components within might allow. This approach saves costs, while allowing the electronic devices to be less bulky, and thus less cumbersome for a consumer to carry or otherwise transport. As a result, most portable electronic devices having such features lack mechanisms therein that protect the internal and/or external components from impacts, e.g., due to daily handling, drops, collisions with other objects, etc. Such impacts may damage display screens (e.g., touchscreen display, non-touchscreen display, etc.) on a surface of a portable electronic device, and/or may damage electronics components housed within the portable electronic device.

For similar reasons (as well as other reasons including non-use near liquids or particulates) most currently available portable electronic devices lack a water-proof or water-resistant seal (or particulate seal) either around a perimeter of a display screen of the electronic device and/or around a perimeter of an inner housing of the electronic device. As a result, inadvertent dropping of the electronic device in standing water or other liquids (or on/near particulates, such as sand, dust, powders, etc.) may damage the internal components, e.g., due to short circuiting by the intruding liquid of electronic components within the portable electronic device (or abrasion/damage to the electronic components due to the intruding particulates within the device).

The embodiments disclosed herein are directed toward overcoming one or more of the problems discussed above.

BRIEF SUMMARY

Various embodiments provide tools and techniques to enable protection of components on a surface and/or within an internal portion of portable electronic devices from impacts due to external forces (e.g., daily handling, drops, collisions with other objects, etc.), while allowing for protection of internal electronic components from liquid or particulate damage (e.g., short-circuits, abrasions, corrosions, rusting, or other damage, etc.) due to liquids or particulates intruding into the internal portion of the portable electronic devices in which the electronic components may be housed.

According to some embodiments, an electronic device might comprise a housing defining an open front face, a chassis disposed within the housing, a panel disposed within the open front face of the housing and supported on the chassis, and an elastomeric overmold surrounding at least a portion of a perimeter of the panel and disposed between at least a portion of the chassis (and/or a portion of the panel) and at least a portion of the housing. In some cases, the overmold might be configured to provide a perimeter seal around the panel (and/or around a display provided on a front surface of the panel) and to deform upon a frontal impact to at least one of the panel, the housing, or the elastomeric overmold. The overmold might also be configured to prevent intrusion of liquids or particulates within the electronic device. In some embodiments, a protective housing, which comprises the housing, the chassis, and the overmold, may be provided for protecting a stand-alone electronic device.

In one aspect, an electronic device might comprise a housing, a chassis, a panel, and a deformable elastomer overmold. The housing might define an open front face. The chassis might be disposed within the housing. In some embodiments, the chassis may be in communication with the housing though a rib and slot interface, and the chassis may be affixed to the housing with a tab and notch interface. Both the rib and slot interface and the tab and notch interface may define a tolerance between the chassis and the housing in a vector substantially normal to the open front face. The panel might be disposed within the open front face of the housing and might be affixed to the chassis. The deformable elastomer overmold may surround a perimeter of the panel and may be disposed between at least a portion of the chassis and at least a portion of the housing. The overmold may, in some embodiments, be configured to provide a perimeter seal around the panel and to deform upon a frontal impact to the panel, allowing compliance between the chassis and the housing to the extent of the tolerance.

In another aspect, an electronic device might comprise a housing defining an open front face, a panel disposed within the open front face of the housing, and a first deformable overmold surrounding at least a portion of a perimeter of the panel and disposed between at least a portion of the panel and at least a portion of the housing.

According to some embodiments, the housing might comprise a shock interface mounted on a rear panel of the housing. The shock interface might comprise one or more support ribs extending between the shock interface and a sidewall of the housing. Each of the one or more support ribs might have a structure configured to support the first deformable overmold when the first deformable overmold is absorbing a force of the frontal impact to the panel.

In yet another aspect, a protective housing for providing impact, water, and particulate protection for an electronic device (such as a stand-alone electronic device) might comprise a housing, a chassis, and an overmold. The housing might define an open front face. The chassis might be disposed within the housing, and might support the electronic device thereon. In such examples, the electronic device might be disposed within the open front face of the housing. The overmold might surround at least a portion of a perimeter of the electronic device and might be disposed between at least a portion of the chassis and at least a portion of the housing.

Various modifications and additions can be made to the embodiments discussed without departing from the scope of the invention. For example, while the embodiments described above refer to particular features, the scope of this invention also includes embodiments having different combination of features and embodiments that do not include all of the above described features.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components. In some instances, various shaded portions (including hatchings, cross-hatchings, and the like) may denote depth-wise differences between adjacent surfaces/components and/or may denote different surfaces/components that abut or are near each other.

FIG. 5A is a front elevation view of an example of a molded elastomer that is positioned within a housing for a portable electronic device, together with a chassis and sub-chassis structure, in accordance with various embodiments.

FIG. 10A is a front elevation view of an example of a housing for a portable electronic device, in accordance with various embodiments.

FIGS. 10B-10C are partial sectional views of the housing, as shown along section line J-J in FIG. 10A, in accordance with various embodiments.

DETAILED DESCRIPTION OF CERTAIN EMBODIMENTS

Figure 1:
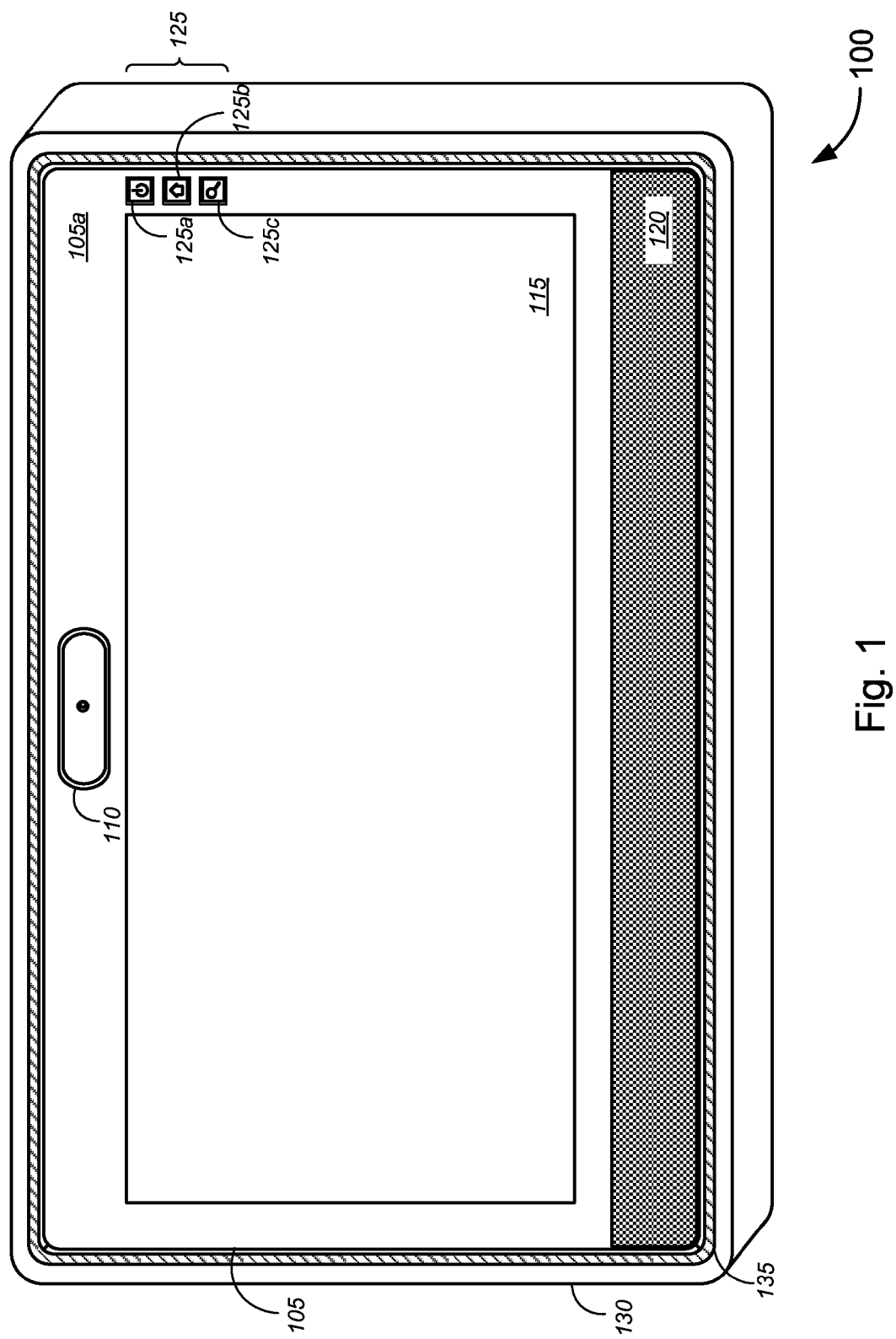
FIG. 1 is a generalized diagram illustrating a front perspective view of an example of a portable electronic device, in accordance with various embodiments.

While various aspects and features of certain embodiments have been summarized above, the following detailed description illustrates a few exemplary embodiments in further detail to enable one of skill in the art to practice such embodiments. The described examples are provided for illustrative purposes and are not intended to limit the scope of the invention.

In the following description, for the purposes of explanation, numerous specific details are set forth in order to provide a thorough understanding of the described embodiments. It will be apparent to one skilled in the art, however, that other embodiments of the present invention may be practiced without some of these specific details. In other instances, certain structures and devices are shown in block diagram form. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Unless otherwise indicated, all numbers used herein to express quantities, dimensions, and so forth used should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

A set of embodiments provides novel chassis suspensions for electronic devices. One embodiment can be employed in a tablet computer or similar device. Another embodiment can be employed in a telephone handset, a mobile telephone, a mobile smart phone, or similar device. Merely by way of example, the '742 Application describes a number of communication systems, including base stations, tablet systems, and handset systems, any (or all) of which can employ various embodiments of the docking solutions described herein. These chassis suspension solutions, as an example, can also be implemented in conjunction with the camera barrel mechanism described in U.S. patent application Ser. No. 13/722,884 filed on a date even herewith by Mack et al. and titled "Camera Barrel Mechanism", which claims priority to provisional U.S. Patent Application No. 61/579,863, filed on Dec. 23, 2011, both of which are incorporated by reference herein in their entirety.

Herein, the term "molded elastomer" is used to describe a component of a portable electronic device that is used to provide shock absorption during impacts and/or to provide water-proofing/water-resistance or particulate-proofing/particulate-resistance, in accordance to various embodiments. The terms "molded elastomer," "elastomer overmold," "overmold," and the like are interchangeable terms for the purpose of describing such a component herein. The terms "housing" and "rear housing" are used to describe a component of the portable electronic device that covers or surrounds at least internal components of the electronic device—as well as the molded elastomer, which extends from within the device to a front surface of the device (and in some embodiments, beyond the front surface of the device, as shown in some figures).

In an aspect of some embodiments, a molded elastomer seals a display of the electronic device, isolates the display around the perimeter, and serves as a shock absorber during frontal impact. An elastomer overmold might, for example, be displaced between a touch panel of the device and a housing of the device, in accordance with some embodiments. The overmold can provide a perimeter seal around the touch panel (e.g., to prevent intrusion of particulates or liquids into the device from around the edges of the touch panel). In some examples, the overmold might be disposed so that it extends in relief beyond the outer surface of the touch panel. The overmold, according to some embodiments, might extend between the chassis of the device and the rear housing, to provide a front impact shock interface between the housing and the chassis. In this way, the overmold can also serve as a shock absorber against frontal impacts to the touch panel (or, on a non-touch enabled device, the display screen).

According to some embodiments, the shock interface can include one or more support ribs between the overmold and a rear portion of the housing, the support rib providing a rigid structure against which the overmold can deform (e.g., upon frontal impact). The shock interface might also include a rib and slot interface that allows compliance between the chassis and the housing, which can be secured by a tab and notch attachment (such as the "snap" mechanism illustrated as tab 155 and notch 165a in, e.g., FIGS. 5B, 6B, 7B, and 8B). The overmold, then, can bias the slots of the chassis against the ribs of the housing, preventing movement of the chassis and display/touch panels (which might be affixed to the chassis using any appropriate fixture) relative to the housing. On a frontal impact to the touch/display panel, however, the overmold can deform (to the extent of the tolerance of the rib and slot interface and/or to the extent of the tolerance of the support rib(s)), allowing translation of the panel/chassis into the housing. At the same time, the deformation of the overmold absorbs at least some of the energy of the frontal shock, preventing that energy from being transferred to the display/touch panels, chassis, and/or electronics of the device.

FIGS. 1-11 variously illustrate some of the features of the novel chassis suspensions for electronic devices referred to above. The skilled reader should note that the devices and systems illustrated by FIGS. 1-11 refer to examples of different embodiments that include various components, which can be considered alternatives and/or can be used in conjunction with one another in the various embodiments. In some aspects, some of the various embodiments may be the same or similar embodiment. Hence, the description herein of the illustrated devices and systems as shown in FIGS. 1-11 is provided for purposes of illustration and should not be considered to limit the scope of different embodiments.

FIG. 1 is a generalized diagram illustrating a front perspective view of an example of a portable electronic device 100, in accordance with various embodiments. In an aspect as shown in FIG. 1, electronic device 100 comprises front panel 105, camera 110, display 115, speaker 120, buttons 125, housing (or rear housing) 130, and molded elastomer 135. Front panel 105 may include front surface 105a—which, according to some embodiments, may include at least one or all of the camera 110, display 115, speaker 120, and buttons 125 imbedded therein and/or extending therefrom. In other words, in these embodiments, the front panel 105 may include at least one or all of the camera 110, display 115, speaker 120, and buttons 125. In some embodiments, the front panel 105 may be a stand-alone electronic device (e.g., a commercially available device); in such cases, the overmold 135 and the housing 130 may serve as added shock (and/or water or particulate) protection that may be purchased separately from the stand-alone electronic device (perhaps, as a bundled accessory or as an after-market accessory, etc.).

Camera 110, in some embodiments, may include a barrel mechanism, an example of which is described in greater detail in co-pending U.S. patent application Ser. No. 13/722,884 filed on a date even herewith by Mack et al. and titled "Camera Barrel Mechanism", which claims priority to provisional U.S. Patent Application No. 61/579,863, filed on Dec. 23, 2011, both of which are incorporated by reference herein in their entirety. For the purposes of this document, camera 110 may include any type of camera that may be mounted (by any known mechanism) on a front panel (or rear panel) of an electronic device (including, but not limited to, charge-coupled devices ("CCDs"), digital still cameras, digital video cameras, phone cameras, optical cameras, and/or other types of semi-conductor-based cameras, etc.).

In some embodiments, camera 120 may include a waterproof or water-resistant layer or coating therein (or on a surface thereof that may be adjacent to surface 105a) that does not significantly negatively affect the quality of captured images. Alternatively, the camera components could individually be made of water-proof or water-resilient materials, and the water-proof or water-resistant layer or coating could be positioned at an interface between the camera 110 and the front panel 105. Such water-proof or water-resistant layer or coating might in some cases also prevent particulates from intruding within the housing via the camera/housing interface, or the like.

In some embodiments, display 115 may include a touchscreen display or a non-touchscreen display. In some embodiments, display 115 may include display technologies selected from a group consisting of liquid crystal display ("LCD") technology, light emitting diode ("LED") technology, and organic light emitting diode ("OLED") technology, etc., any of which may utilize edge-lighting technology, back-lighting technology, and/or active-matrix technology. Display screen 115, according to some embodiments, may further include a glass layer selected from protective glass, high-density glass, and/or other glasses which are doped or otherwise infused with strengthening materials (as known to those skilled in the art). Protective coatings (as also known to those skilled in the art) may additionally be added to an external surface of the display screen 115.

In some embodiments, display 115 may include a water-proof or water-resistant layer or coating (which might also protect against particulates and the like) thereon that does not significantly negatively affect image display quality. Alternatively, or additionally, the water-proof or water-resistant layer or coating could be positioned at an interface between the display 115 and the front panel 105 (e.g., via an overmold structure surrounding a perimeter of the display 115, e.g., as shown in FIGS. 7 and 8).

According to some embodiments, speaker 120 may include a speaker grill and speaker assembly (both as known to those skilled in the art). The speaker grill and speaker assembly, in some embodiments, may be attached to chassis 165 (as shown in, and as described below with respect to, e.g., FIG. 6). In alternative embodiments, the speaker grill and speaker assembly may be attached to front panel 105 and/or housing 130.

In some embodiments, speaker 120 may include a water-proof or water-resistant layer or coating (which might also protect against particulates and the like) therein that does not significantly negatively impact sound quality. Alternatively, the speaker components could individually be made of water-proof or water-resilient materials, and the water-proof or water-resistant layer or coating could be positioned at an interface between the speaker 120 and the front panel 105 and/or the housing 130 (depending on whether the speaker 120 abuts one or both of the front panel 105 and the housing 130).

Buttons 125, in some examples, may include buttons provided in front panel 105 and/or on a side or other external surface of housing 130. In some embodiments, buttons 125 may be "hard" buttons (i.e., physical buttons embedded in a surface of the front panel 105 and/or housing 130) including, but not limited to, a power button 125a, a menu or home button 125b, and a search button 125c. Other buttons—including, but not limited to, a zoom in button, a zoom out button, a back button (e.g., for web-browsing), a forward button (e.g., for web-browsing), a favorites button, volume control buttons (e.g., volume up button, volume down button, mute button, etc.), an e-mail button, multimedia control buttons (e.g., play button, pause button, media reverse button, media forward button, stop button, record button, etc.), a calculator button, an undo button, a redo button, and the like—may also be included either on the front panel 105 or on an external surface of housing 130. Buttons 125, according to some embodiments, may include at least one "soft" button (i.e., a region corresponding to a portion of an input field on a touchscreen display (such as display 115) that may usually be denoted by a graphical representation of a button, etc.), which might be configured to perform any of the functions of the "hard" buttons mentioned above. In some examples, each button 125 might have a profile shape selected from a group consisting of circle, square, rectangle, triangle, any curved shape, any polygonal shape, and any combination of these shapes, etc. Each button 125, according to some embodiments, might have a contact surface (i.e., surface on which a user's finger may make contact to actuate the button) that may be at least one of raised, recessed, flat, generally concave, generally convex, smooth, rough, soft, hard, or any combination of these characteristics.

In some embodiments, buttons 125 may include a water-proof or water-resistant layer or coating (which might also protect against particulates and the like) therein that does not significantly negatively impact actuation quality. Alternatively, the button components could individually be made of water-proof or water-resilient materials, and the water-proof or water-resistant layer or coating could be positioned at an interface between each button 125 and the front panel 105 and/or the housing 130 (depending on whether each button 125 is provided on a surface of one or both of the front panel 105 and the housing 130). In yet another alternative example, a water-proof or water-resistant layer or coating may be provided over each button 125 such that any gaps between each button 125 and the surface of the front panel 105/housing 130 may be covered by the layer or coating. In one aspect, such a coating or layer may cover a portion of the exposed surface of the front panel 105, all of the exposed surface of the front panel 105, a portion of housing 130, and/or all of the housing 130.

FIGS. 2-5 illustrate various different embodiments, each embodiment representing an electronic device 100 in different stages of disassembly, showing one or more components in position relative to one another. In some cases (i.e., in the cases where shock interface 140 includes only one of ribs 150 as shown in FIG. 3 or ribs 150 as shown in FIG. 4), the embodiments of FIGS. 2-5 represent the same embodiment at different states of disassembly, while FIG. 6 shows a fully assembled device 100.

Figure 2A:
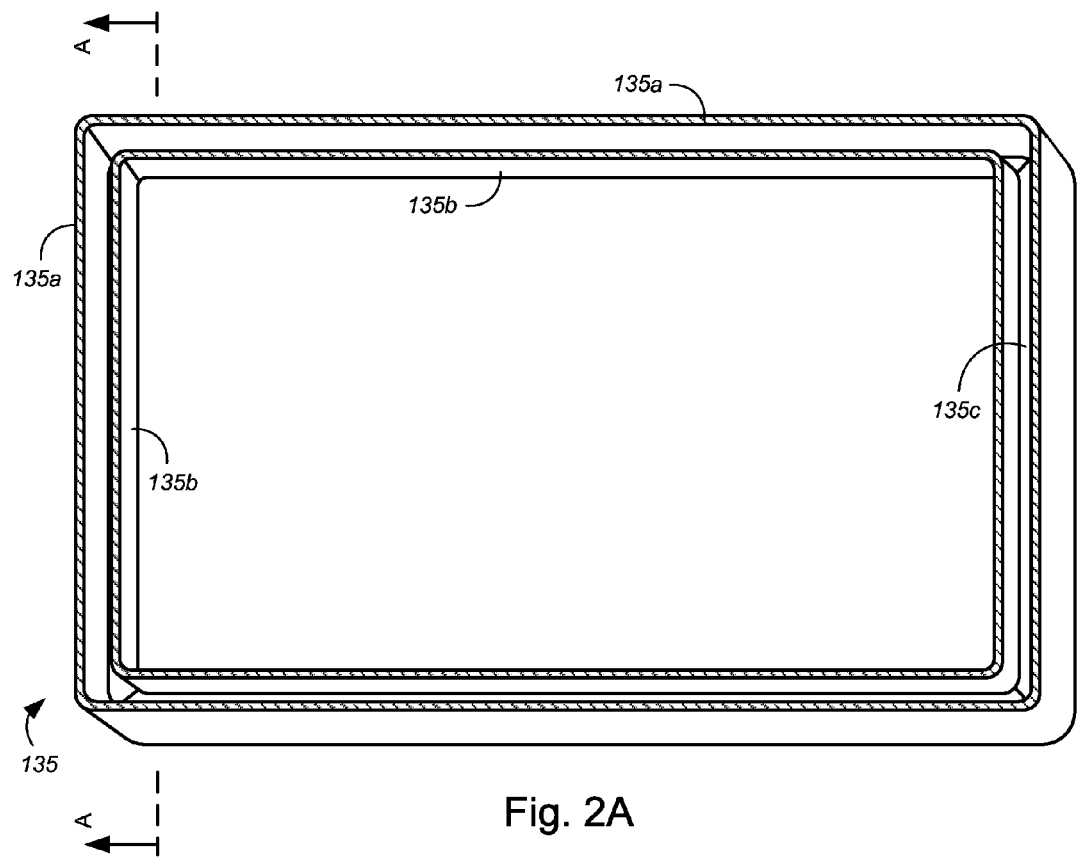
FIG. 2A is a front perspective view of an example of a molded elastomer for a portable electronic device, in accordance with various embodiments.
Figure 2B:
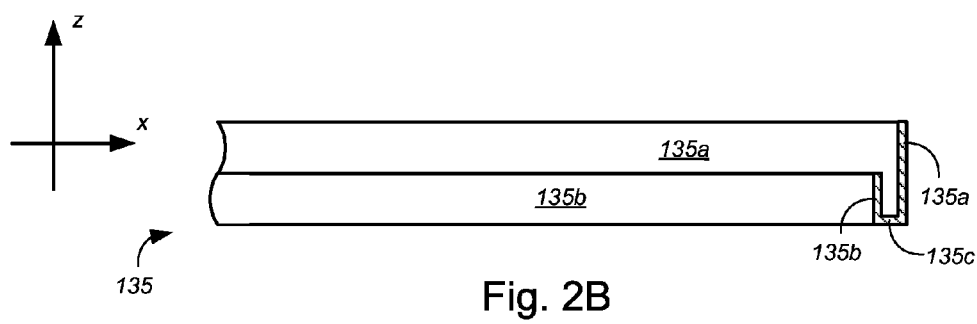
FIG. 2B is a partial sectional view of the molded elastomer, as shown along section line A-A in FIG. 2A, in accordance with various embodiments.

FIG. 2A is a front perspective view of an example of a molded elastomer 135 for a portable electronic device 100, in accordance with various embodiments. FIG. 2B is a partial sectional view of the molded elastomer 135, as shown along section line A-A in FIG. 2A, in accordance with various embodiments. As shown in FIG. 2, molded elastomer or overmold 135 may comprise an outer wall 135a, an inner wall 135b, and a base 135c connecting the outer wall 135a and the inner wall 135b. Overmold 135 may be made from a single elastomer, rubber, or silicone material (or other elastomeric material), such as via, e.g., a molding process (e.g., injection molding, compression molding, or the like, etc.). Alternatively, each of the outer wall 135a, inner wall 135b, and base 135c may be individually molded and subsequently bonded together (e.g., by heat bonding, adhesives, etc.). In yet another alternative example, one of the outer wall 135a or inner wall 135b may be molded together with base 135c, and the resultant L-shaped structure bonded together with the other of the outer wall 135a or inner wall 135b.

Figure 5B:
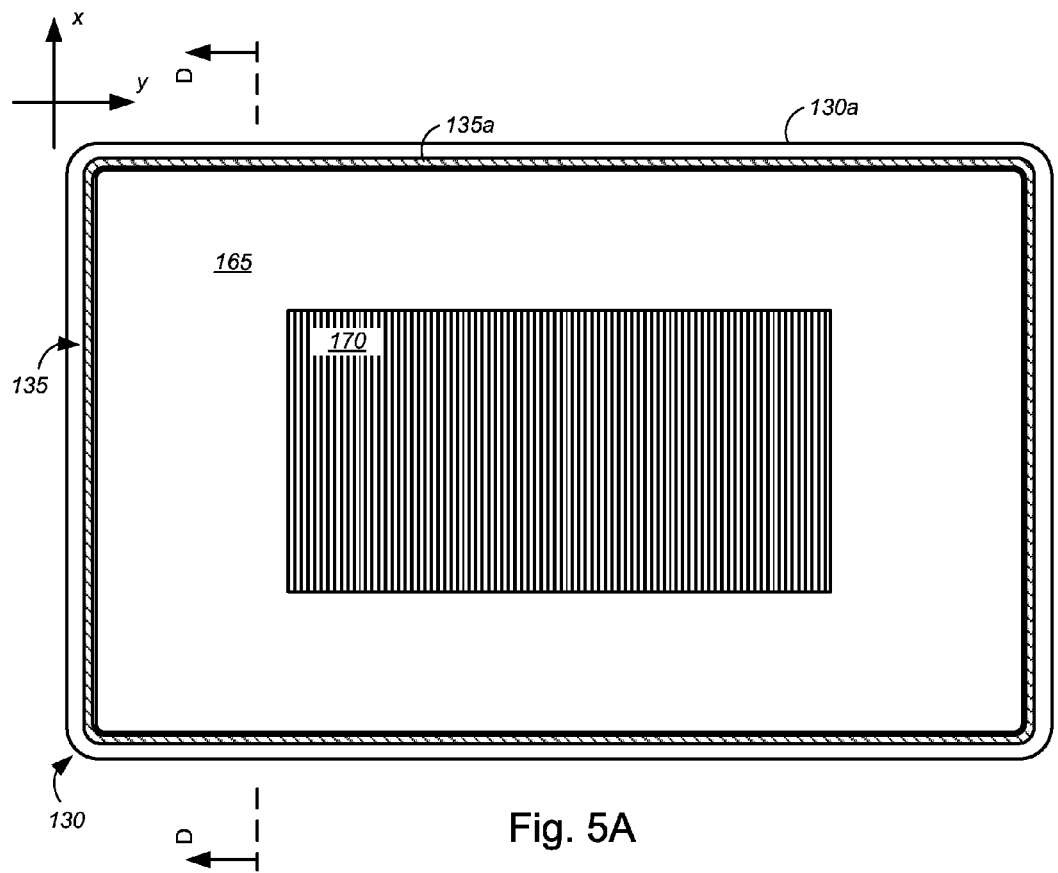
FIG. 5B is a partial sectional view of the housing, molded elastomer, chassis, and sub-chassis, as shown along section line D-D in FIG. 5A, in accordance with various embodiments.
Figure 5C:
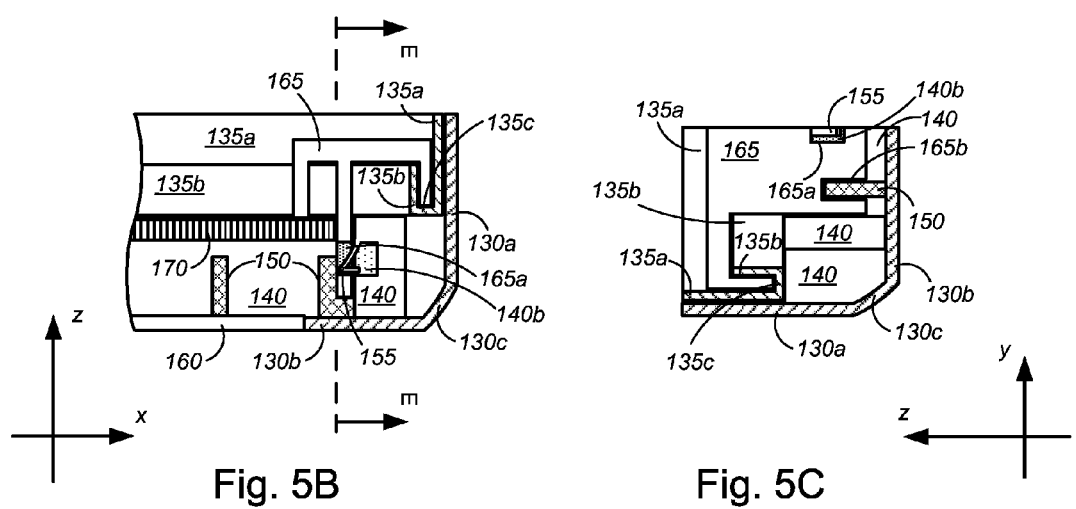
FIG. 5C is a sectional view of the housing, molded elastomer, and chassis, as shown along section line E-E in FIG. 5B, in accordance with various embodiments.
Figure 6A:
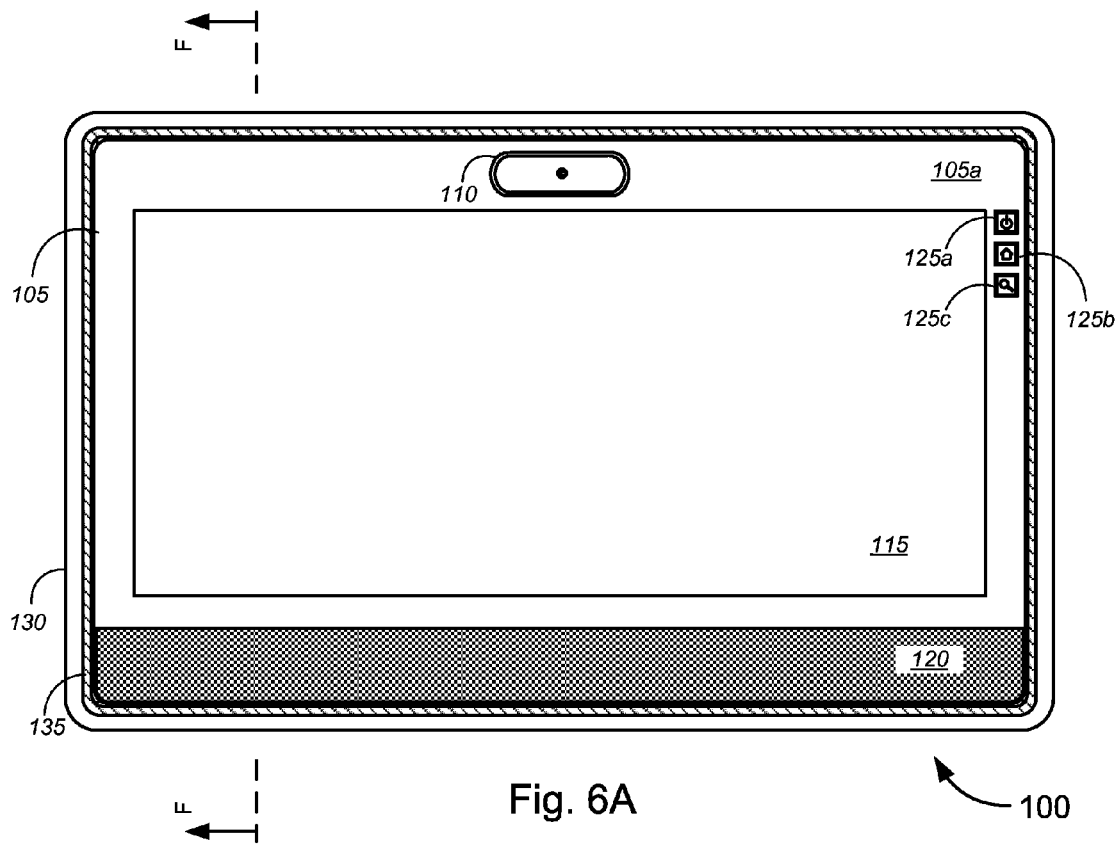
FIG. 6A is a front elevation view of an example of a portable electronic device, in accordance with various embodiments.
Figure 6B:
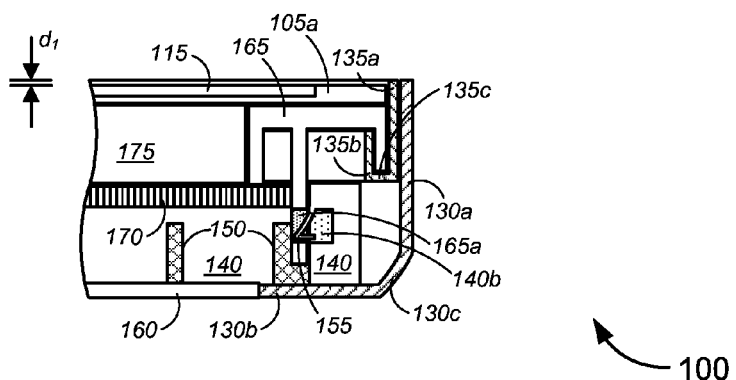
FIG. 6B is a partial sectional view of the portable electronic device, as shown along section line F-F in FIG. 6A, in accordance with various embodiments.
Figure 7A:
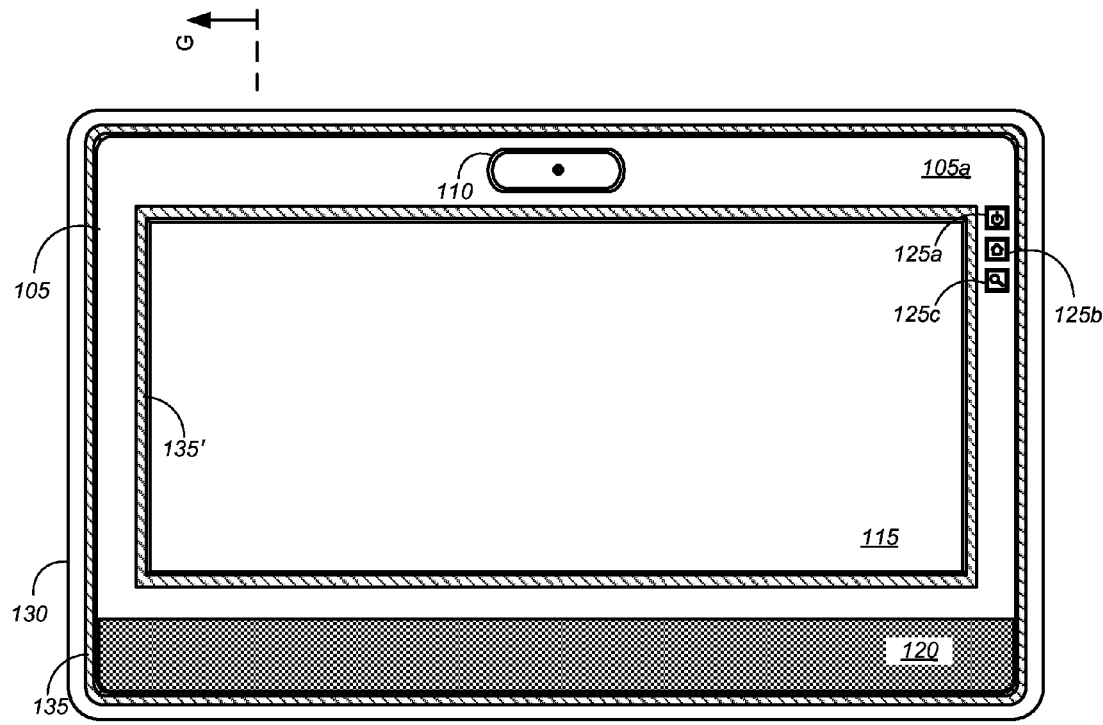
FIG. 7A is a front elevation view of an example of a portable electronic device, in accordance with various embodiments.
Figure 7B:
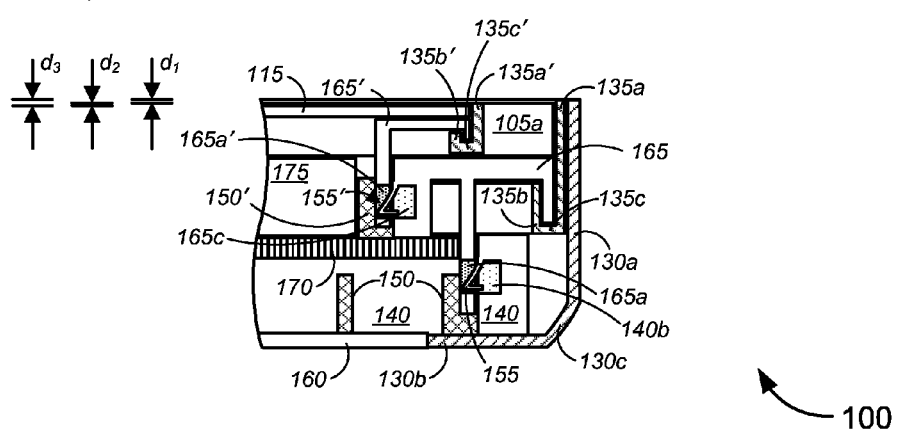
FIG. 7B is a partial sectional view of the portable electronic device, as shown along section line G-G in FIG. 7A, in accordance with various embodiments.

In any case, the outer wall 135a of overmold 135 may be configured so as to conform to a shape matching a front profile shape of front panel 135 (e.g., in the embodiments as shown in FIGS. 1-7) and/or display 115 (e.g., in the embodiments as shown in FIGS. 7-8), to form a perimeter seal around an outer perimeter of the front panel 135 and/or the display 115. At the same time, the outer wall 135a may be configured to conform to a front opening of housing 130, so as to form a perimeter seal around an inner perimeter of the front opening of housing 130; in some cases, the front opening of housing 130 may be configured so as to conform to the (outer perimeter) shape of the outer wall 135a, which may in turn be shaped to conform to the front profile shape of front panel 135. The inner wall 135b (and the base 135c) may be configured so as to conform to the shape of an outer lip portion of the chassis 135 or 135' (as shown, e.g., in FIG. 7B), on which the front panel 105 may rest (e.g., in the embodiments as shown in FIGS. 1-7) and/or on which the display 115 may rest (e.g., in the embodiments as shown in FIGS. 7-8). Accordingly, the outer wall 135a might have a height dimension (i.e., along the z-axis dimension) that may be larger than that of the inner wall 135b, e.g., as shown in the embodiments in FIGS. 2B, 4B, 5B, 6B, and 7B).

Figure 3A:
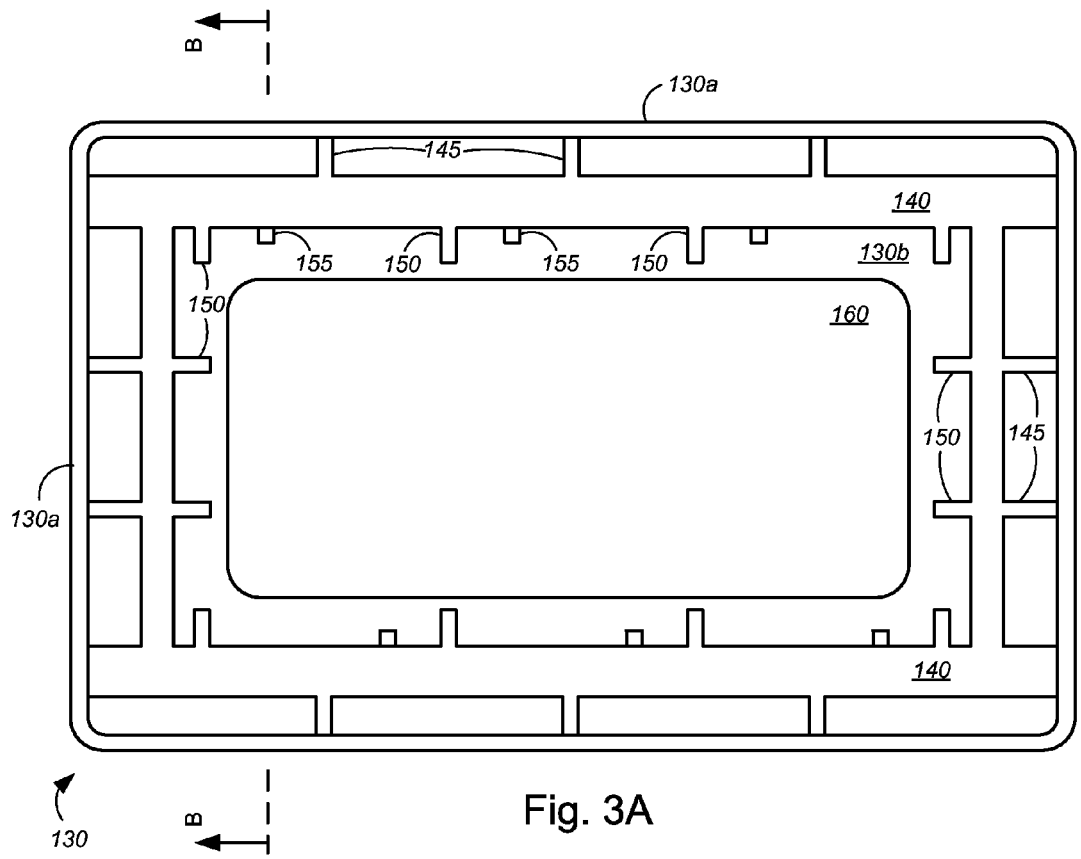
FIG. 3A is a front elevation view of an example of a housing for a portable electronic device, in accordance with various embodiments.
Figure 3B:
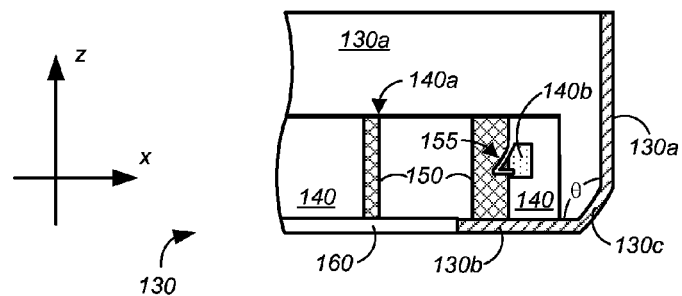
FIG. 3B is a partial sectional view of the housing, as shown along section line B-B in FIG. 3A, in accordance with various embodiments.

We now turn to FIG. 3, which illustrates an example of housing 130. FIG. 3A is a front elevation view of an example of a housing 130 for a portable electronic device 100, in accordance with various embodiments. FIG. 3B is a partial sectional view of the housing 130, as shown along section line B-B in FIG. 3A, in accordance with various embodiments. As shown in FIG. 3, housing 130 may comprise side walls 130a, rear panel 130b, and shock interface 140. In some embodiments, shock interface 140 may comprise a plurality of support ribs 145, a plurality of alignment ribs 150, and a plurality of tabs 155. A top surface of support ribs 145 and alignment ribs 150 may, in some examples, be flush with a top surface of shock interface 140. Alternatively, in some embodiments (e.g., as shown in FIG. 4), alignment ribs 150 might have a height extending from rear panel 130b to some middle point between rear panel 130b and a top surface of shock interface 140; preferably, the height of alignment ribs 150 should be sufficient large to engage with (slot 165a of) chassis 165 (e.g., a height approximately equal to at least 50% of the distance between the rear panel 130b and the top surface of shock interface 140).

Tabs 155, according to some embodiments, might be formed as an integral part of shock interface 140, via, e.g., a molding process or a machining process, etc. In some embodiments, tabs 155 may be configured to bend into opening/cavity 140b within shock interface 140, particularly, in response to a force directed downward (i.e., in the negative z-axis direction) and/or in a direction into the cavity 140b (i.e., in the x-axis direction). Once the force is released, the tabs 155 are configured to return to their original shape and position before encountering the force (i.e., as shown in FIG. 3B).

In the embodiments as shown in FIG. 3B, housing 130 may include a curved wall portion 130c formed between side walls 130a and rear panel 130b. In alternative embodiments, however, housing 130 may include side walls 130a that join directly with rear panel 130b, without curved wall portion 130c. In any case, side walls 130a might, in some cases, be formed at an angle θ with respect to rear panel 130b, where angle θ might be any angle, for example, between a range of 30° to 150°, or preferably between a range of 60° to 120°, or more preferably between a range of 80° to 100°. In some cases, angle θ might be approximately 90°, such as shown in the various embodiments of FIGS. 3-11.

In some embodiments, housing 130 may further include access panel cover 160, which might provide access to an internal portion of housing 130 (e.g., to physically make contact and actuate tabs 155 or to access electronic components housed within housing 130). Cover 160 may include one of a hinged door that may be permanently affixed to rear panel 130b at one edge of cover 160 (which may be configured by any hinge mechanism known to those skilled in the art), a removable door (which may be attached by any detachable cover mechanism known to those skilled in the art), or a slidable door (which may be configured by any sliding door mechanism known to those skilled in the art), with corresponding structure on the rear panel 130b.

Figure 4A:
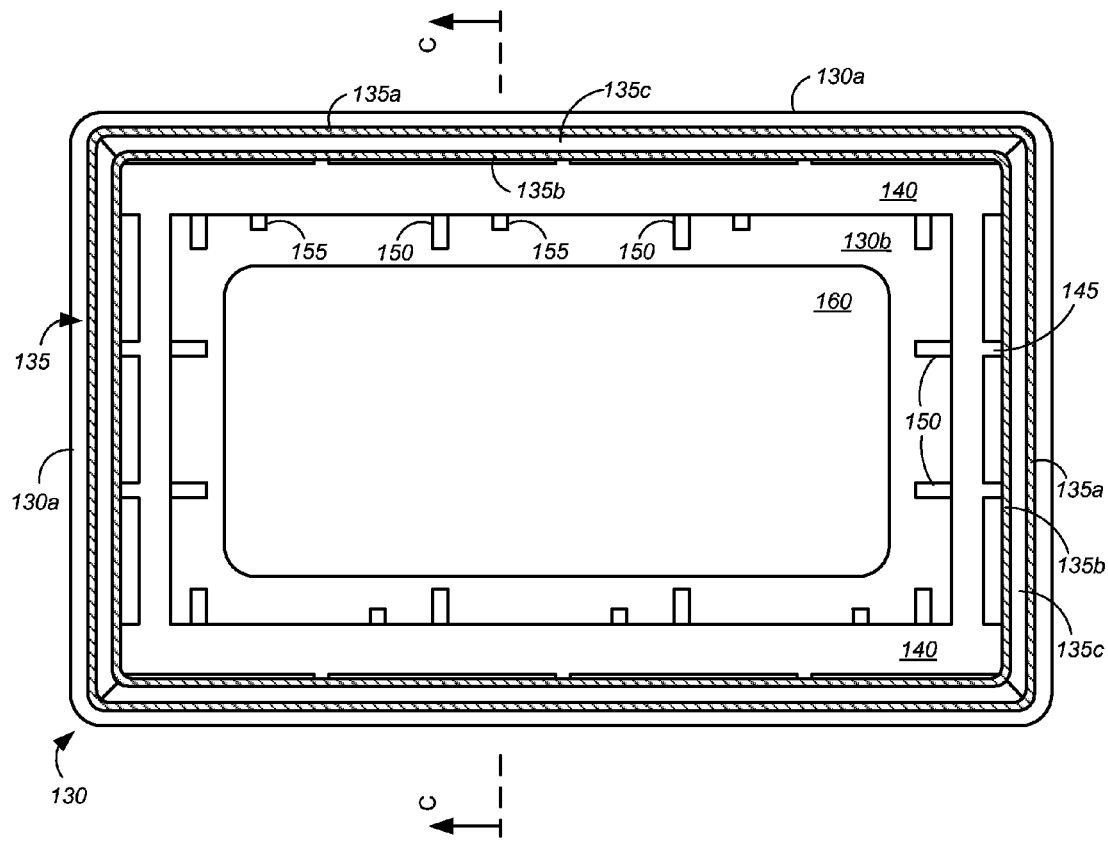
FIG. 4A is a front elevation view of an example of a molded elastomer that is positioned within a housing for a portable electronic device, in accordance with various embodiments.
Figure 4B:
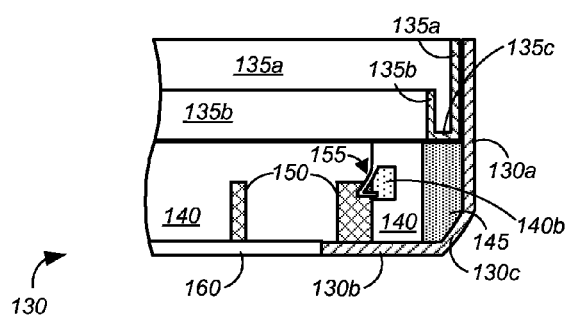
FIG. 4B is a partial sectional view of the housing with the molded elastomer that is positioned therein, as shown along section line C-C in FIG. 4A, in accordance with various embodiments.

FIG. 4A is a front elevation view of an example of a molded elastomer 135 that is positioned within a housing 130 for a portable electronic device 100, in accordance with various embodiments. FIG. 4B is a partial sectional view of the housing 130 with the molded elastomer 135 that is positioned therein, as shown along section line C-C in FIG. 4A, in accordance with various embodiments. As shown in FIG. 4, molded elastomer or overmold 135 may be fitted within housing 130, such that base 135c of overmold 135 rests on support ribs 145 of shock interface 140. In some embodiments, overmold 135 may also rest on portions of the shock interface 140 itself (e.g., as shown near the inner corners of housing 130 in FIG. 4A).

FIG. 5A is a front elevation view of an example of a molded elastomer 135 that is positioned within a housing 130 for a portable electronic device 100, together with a chassis 165 and a sub-chassis 170, in accordance with various embodiments. FIG. 5B is a partial sectional view of the housing 130, molded elastomer 135, chassis 165, and sub-chassis 170, as shown along section line D-D in FIG. 5A, in accordance with various embodiments. FIG. 5C is a sectional view of the housing 130, molded elastomer 135, and chassis 165, as shown along section line E-E in FIG. 5B, in accordance with various embodiments. As shown in FIG. 5A, chassis 165 may be shaped to fit an inner shape of inner wall 135a of molded elastomer or overmold 135. As shown in FIGS. 5B and 5C, chassis 165 may include a flat portion generally parallel to the x-y plane (as shown in FIGS. 5B and 5C) and an outer lip portion that extends in a direction generally along (or parallel to) the negative z-axis direction from an outer edge(s) of the flat portion of chassis 165, around an outer perimeter (i.e., along the outer edge(s)) of chassis 165, where the outer lip portion might have a shape fitting within, and generally conforming to, a U-shaped region defined by outer wall 135a, inner wall 135b, and base 135c of overmold 135. In some embodiments, the U-shaped region might snugly fit about the outer lip portion along the outer perimeter of the chassis 165.

Chassis 165 might also include an inner lip portion that may be affixed to sub-chassis 170, the inner lip extending in a direction generally along (or parallel to) the negative z-axis direction from an inner edge(s) of the flat portion of chassis 165. Chassis 165 might further include an inner wall portion that may extend between the inner and outer lips of chassis 165, in a direction generally along (or parallel to) the negative z-axis direction and/or in a direction generally parallel with an inner wall of shock interface 140. The middle wall may run parallel with an entire perimeter of chassis 165, in some examples, while in other examples, the middle wall may run parallel with two opposing side walls 130a of electronic device 100. In any case, the middle wall of chassis 165 may include a plurality of slots 165b corresponding to, and shaped to fit about, alignment ribs 150 of shock interface 140. The engagement of the plurality of slots 165b with alignment ribs 150 provides vertical compliance between the chassis assembly and the housing 130, thus preventing lateral movement (i.e., in a direction parallel with the x-y plane) and downward movement (i.e., in the negative z-axis direction) of chassis 165 relative to housing 130. The middle wall of chassis 165 might further include notch 165a, which might engage with tab 155 of shock interface 140 when the chassis 165 is resting within the housing 130 (i.e., when slots 165b are engaged with ribs 150), to prevent movement of chassis 165 along the positive z-axis direction, thus securing the chassis 165 (and sub-chassis 170, along with components of the electronic device 100 that are mounted on or housed in chassis 165 and sub-chassis 170) within housing 130. When chassis 165 is lowered into housing 130, a bottom portion of the middle wall of chassis 165 applies a force directed downward (i.e., in the negative z-axis direction) and/or in a direction into the cavity 140b (i.e., in the x-axis direction), which might cause tabs 155 to bend inward into opening/cavity 140b within shock interface 140 (in a manner as discussed above). When chassis 165 is lowered such that tabs 155 encounter notches 165a, the force ceases to be applied by the middle wall of the chassis 165, resulting in the tabs 155 returning to their original shape and position before encountering the force. A flat portion of each tab 155, which is generally parallel with at least a lower inner surface of each notch 165a, might prevent the middle wall (and thus the entire chassis 165) from moving along the positive z-axis direction.

Chassis 165 may be disengaged from the housing 130 by, for example, disengaging tabs 155, which might be accomplished by applying a force in a direction into the cavity 140b. Such a force may be applied via use of a tool, such as a screw driver, or a custom tool, etc., that may enter the inner portion of housing 130 via cover 160. Alternatively, a built-in release mechanism (such as release mechanism 190, as shown in FIGS. 10-11) might be provided within housing 130 to disengage tabs 155 from notches 165a. In some cases, the tool or release mechanism might allow for simultaneous disengagement of a plurality (or all) of tabs 155. Once each tab 155 is clear of each notch 165a, chassis 165 may be removed from the housing 130.

The region defined by the inner walls of the inner lip portion and the sub-chassis 170 may be used to support and/or house additional electronics 175 (as shown, e.g., in FIG. 6B) for the components of the front panel 105 (including, but not limited to, power supplies (e.g., power adapters, transformers, batteries, etc.), control circuitry, support structures, actuators, etc. for at least one of camera 110, display 115, speakers 120, or buttons 125). The height of the inner lip portion may be configured to appropriately account for space requirements for such components. The inner lip portion might, in some examples, extend along an inner perimeter (i.e., along the inner edge(s)) of chassis 165. In other examples, the inner lip portion might extend along only portions of the inner perimeter/inner edge(s) of chassis 165, such that the space defined generally by the middle wall, the inner lip, the flat portion, and the sub-chassis may be utilized for additionally housing the additional electronics 175.

According to some embodiments, sub-chassis 170 might be affixed (or otherwise secured) to the middle wall of chassis 165, thus ensuring the stability of sub-chassis 170 relative to chassis 165. In some embodiments, sub-chassis 170 may be formed of sheet metal. In some cases, venting holes may be formed in the sub-chassis 170 to allow for thermal ventilation into the inner portion of the housing 130. Other cooling devices (e.g., heat sinks, etc.) might also be provided.

As shown in FIG. 5B, alignment ribs 150 are shown having heights below a top surface of shock interface 140. This allows, in some cases, for sub-chassis 170 to have a shape that substantially fills a space defined by the middle walls of chassis 165 (or, in the case of the middle walls only extending parallel to a pair of opposing sidewalls 130a of housing 130, a space defined by the middle walls and inner walls of shock interface 140). In the embodiments where alignment ribs 150 have heights substantially equal to a height of shock interface 140 (i.e., with a top surface of alignment ribs 150 flush with a top surface of shock interface 140), sub-chassis 170 might include slots (similar to slots 165b) that might correspond to, and be shaped to fit about, alignment ribs 150.

The combined structure according to the various embodiments as described with respect to FIGS. 5A-5C (or equivalents thereof, some of which may be described with respect to subsequent figures) are herein collectively referred to as a "protective housing," which might be used to protect a front panel of an electronic device or a stand-alone electronic device, as well as corresponding internal electronics and other components of each device, from impacts, particulate matter, and/or liquids. Although the figures refer to a front panel 105 being installed within the protective housing, the front panel 105 may denote a front panel of a stand-alone electronic device and/or the stand-alone electronic device that may be installed within the protective housing. Thus, any reference to front panel 105 below may be applicable to a stand-alone electronic device, and vice versa. FIGS. 6-8, for example, show front panel 105 or a stand-alone electronic device fitted within the protective housing.

FIG. 6A is a front elevation view of an example of a portable electronic device 100, in accordance with various embodiments. FIG. 6B is a partial sectional view of the portable electronic device 100, as shown along section line F-F in FIG. 6A, in accordance with various embodiments. As shown in FIG. 6B, front panel 105 might rest on the flat portion of chassis 165, with the various additional electronics 175 resting within the space defined by the inner lip of chassis 165 and sub-chassis 170. As further shown in FIG. 6A and 6B, outer wall 135a of overmold 135 forms a seal about a perimeter of front panel 105a. In some embodiments (such as shown in FIG. 6B), the outer wall 135a of overmold 135 might be formed and disposed so as to extend in relief above surface 105a of front panel 105. In other words, the outer wall 135a is formed about a perimeter of front panel 105 such that front panel 105 is recessed with respect to outer wall 135a, with surface 105a recessed by a distance $d_1$ below a top surface of outer wall 135a. A top surface of sidewall 130a might be formed, in some embodiments (such as shown in FIG. 6B), so as to be flush with the top surface of outer wall 135a. With the outer wall 135a (and perhaps also sidewall 130a) so formed to extend from surface 105a by distance $d_1$, the front panel 105 (as well as components such as camera 110, display 115, buttons 125, and/or speaker 120) may be protected from frontal impact, such as that caused when the portable electronic device 100 is dropped with the front panel 105 facing down. Upon frontal impact, the overmold 135 (and/or housing 130) might receive the initial force of impact. In such cases, the overmold 135 would deform to absorb (and harmlessly dissipate) the impact force, thus protecting the front panel 105 (or stand-alone electronic device) and any associated additional electronics 175 housed on the chassis 165 and/or sub-chassis 170.

In some embodiments, each, or both, of the rib and slot interface (defined by ribs 150 and slots 165b) and the tab and notch interface (defined by tabs 155 and notches 165a) might define a first tolerance between chassis 165 and housing 130 in a vector that is substantially normal to the open front face of the protective housing (i.e., in a direction parallel to the z-axis direction in FIGS. 2, 3, and 5)—where the open front face might be defined, e.g., by the inner perimeter of inner wall 135a of overmold 135, above chassis 165, as shown in FIG. 5. Upon impact (such as frontal impact of the device 100, e.g., as shown in FIG. 6), the overmold 135 might be configured to deform, allowing compliance between the chassis 165 and housing 130 to the extent of said first tolerance.

Although the overmold 135 might be used to surround and protect a perimeter of front panel 105 (e.g., as shown in, and described with respect to, FIGS. 1-6), a similar overmold structure may be used to also protect display 115 directly. Such similar overmold structure is shown, e.g., in FIGS. 7-8.

FIG. 7A is a front elevation view of an example of a portable electronic device 100, in accordance with various embodiments. FIG. 7B is a partial sectional view of the portable electronic device 100, as shown along section line G-G in FIG. 7A, in accordance with various embodiments. As shown in FIG. 7, the protective housing (as described with respect to FIGS. 1-6) may further comprise display overmold 135', display chassis 165', and alignment ribs 150'. Overmold 135' might comprise outer walls 135a', inner walls 135b', and base 135c' that are similar to, but of different (actual or relative) dimensions from, outer walls 135a, inner walls 135b, and base 135, as described above. Display chassis 165' might comprise a flat portion (similar to the flat portion of chassis 165), an outer lip (similar to the outer lip of chassis 165), and a wall portion (similar to the middle wall of chassis 165, except that display chassis 165' might forego an inner lip, resulting in the wall portion of display chassis 165' being at the inner edge(s)/perimeter of display chassis 165' (i.e., at a relative position similar to the inner lip of chassis 165)). A tab/notch structure for the display 115 might comprise notches 165a' (which are fitted within the wall portion of display chassis 165') and tabs 155' (which are fitted within, and extend from, openings/cavities 165c of chassis 165). Aside from their location and dimensions, notches 165a' and tabs 155' (and openings/cavities 165c) are otherwise similar in form and function to notches 165a and tabs 155 (and openings/cavities 140b). Notches 165a' and tabs 155' might be engaged in a manner similar to how notches 165a and tabs 155 are engaged (as described in detail above with respect to FIG. 6). To disengage notches 165a' and tabs 155', tabs 155' may be disengaged in a similar manner as disengagement of tabs 155 (as discussed above), with tabs 155' being accessed (via an appropriate tool) either through an opening resulting from the display 115 (and other additional electronics 170) being removed, through openings in sub-chassis 170 (accessed via cover 160), or via release mechanisms (such as those as shown in FIGS. 10-11).

As shown in FIG. 7B, the outer wall 135a of overmold 135 might be formed and disposed so as to extend in relief above surface 105a of front panel 105 by a distance of $d_1$ (similar to the structure as shown in FIG. 6B). Likewise, outer wall 135a' of display overmold 135' might be formed and disposed so as to extend in relief above a top surface of display 115 by a distance of $d_2$, such that the top surface of display 115 is recessed with respect to a top surface of outer wall 135a of overmold 135 (and perhaps also a top surface of sidewall 130a) by a distance of $d_3$. With both the outer walls 135a and 135a' so formed, the display 115 (and any display electronics housed with display chassis 165') may be further protected from frontal impacts (similar to the protection offered by the embodiments, e.g., as described above with respect to FIG. 6).

In some embodiments, each, all, or any combination, of a primary rib and slot interface (defined by ribs 150 and slots 165b), a secondary rib and slot interface (defined by ribs 150' and slots (not shown) in display chassis 165'), a primary tab and notch interface (defined by tabs 155 and notches 165a), and a secondary tab and notch interface (defined by tabs 155' and notches 165a') might define a second tolerance between chassis 165 and housing 130 and between display chassis 165' and chassis 165/sub-chassis 170 in a vector that is substantially normal to the open front face of the protective housing (i.e., in a direction parallel to the z-axis direction in FIGS. 2, 3, and 5)—where the open front face might be defined, e.g., by the inner perimeter of inner wall 135a of overmold 135 and/or by the inner perimeter of inner wall 135a' of overmold 135', above chassis 165. Upon impact (such as frontal impact of the device 100, e.g., as shown in FIG. 7), the overmold 135 and/or overmold 135' might be configured to deform, allowing compliance between the chassis 165 and housing 130 and between display chassis 165' and chassis 165/sub-chassis 170 to the extent of said second tolerance.

According to some embodiments, the primary rib and slot interface (defined by ribs 150 and slots 165b) and the primary tab and notch interface (defined by tabs 155 and notches 165a) might define a third tolerance between chassis 165 and housing 130 in the vector that is substantially normal to the open front face of the protective housing. The secondary rib and slot interface (defined by ribs 150' and slots (not shown) in display chassis 165') and the secondary tab and notch interface (defined by tabs 155' and notches 165a') might define a fourth tolerance between display chassis 165' and chassis 165/sub-chassis 170 in the vector that is substantially normal to the open front face of the protective housing. Upon impact (such as frontal impact of the device 100, e.g., as shown in FIG. 7), the overmold 135 might be configured to deform, allowing compliance between the chassis 165 and housing 130 to the extent of said third tolerance. Separately or concurrently, the overmold 135' might be configured to deform, allowing compliance between the display chassis 165' and chassis 165/sub-chassis 170 to the extent of said fourth tolerance.

Figure 8A:
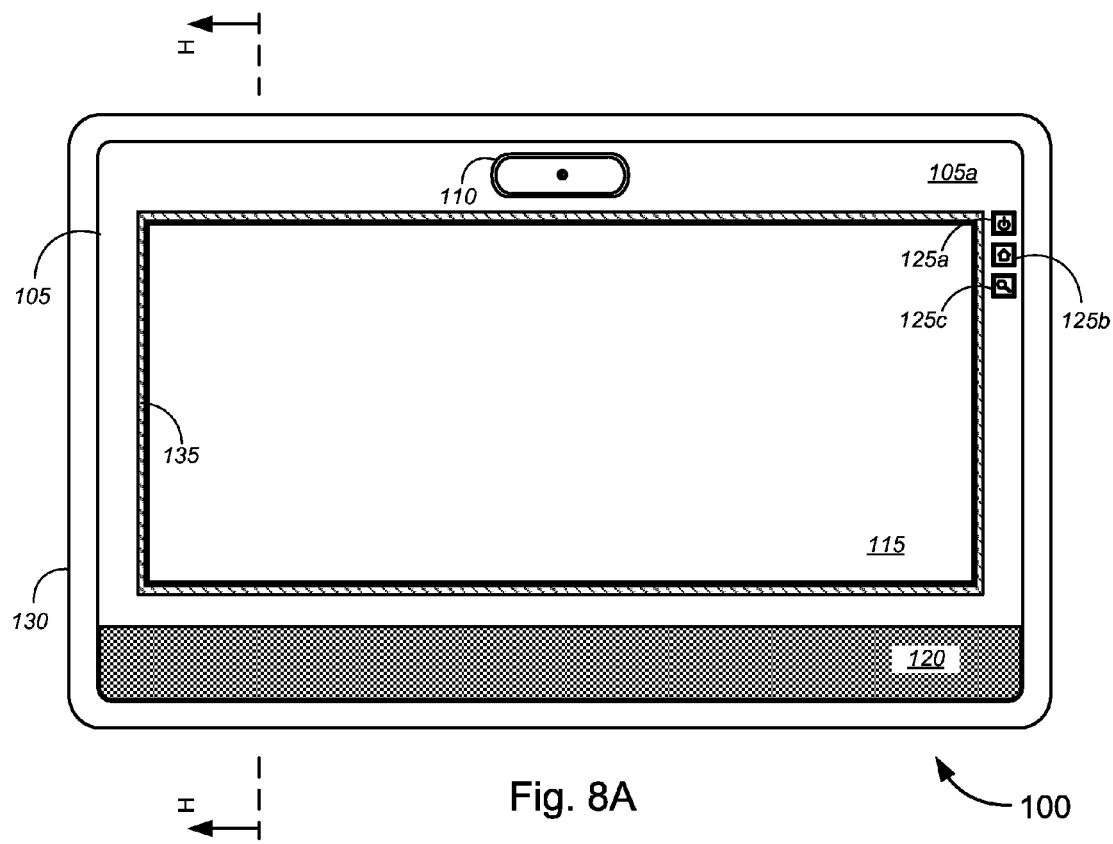
FIG. 8A is a front elevation view of an example of a portable electronic device, in accordance with various embodiments.
Figure 8B:
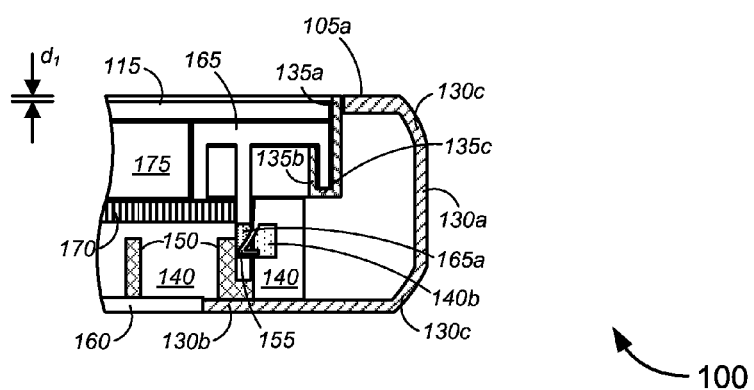
FIG. 8B is a partial sectional view of the portable electronic device, as shown along section line H-H in FIG. 8A, in accordance with various embodiments.

FIG. 8A is a front elevation view of an example of a portable electronic device 100, in accordance with various embodiments. FIG. 8B is a partial sectional view of the portable electronic device 100, as shown along section line H-H in FIG. 8A, in accordance with various embodiments. As shown in FIG. 8, overmold 135 might form a perimeter seal about a perimeter of display 115 (similar to overmold 135' in FIG. 7). As shown in FIG. 8B, front panel 105 might be integrally formed with housing 130, with a curved portion 130c joining front panel 105 with sidewalls 130a (similar to curved portion 130c joining rear panel 130b with sidewalls 130a, as described above with respect to FIG. 3B). The structure of the embodiments as shown in FIG. 8 might otherwise be similar in form and function to that as shown in FIGS. 1-7.

Figure 9A:
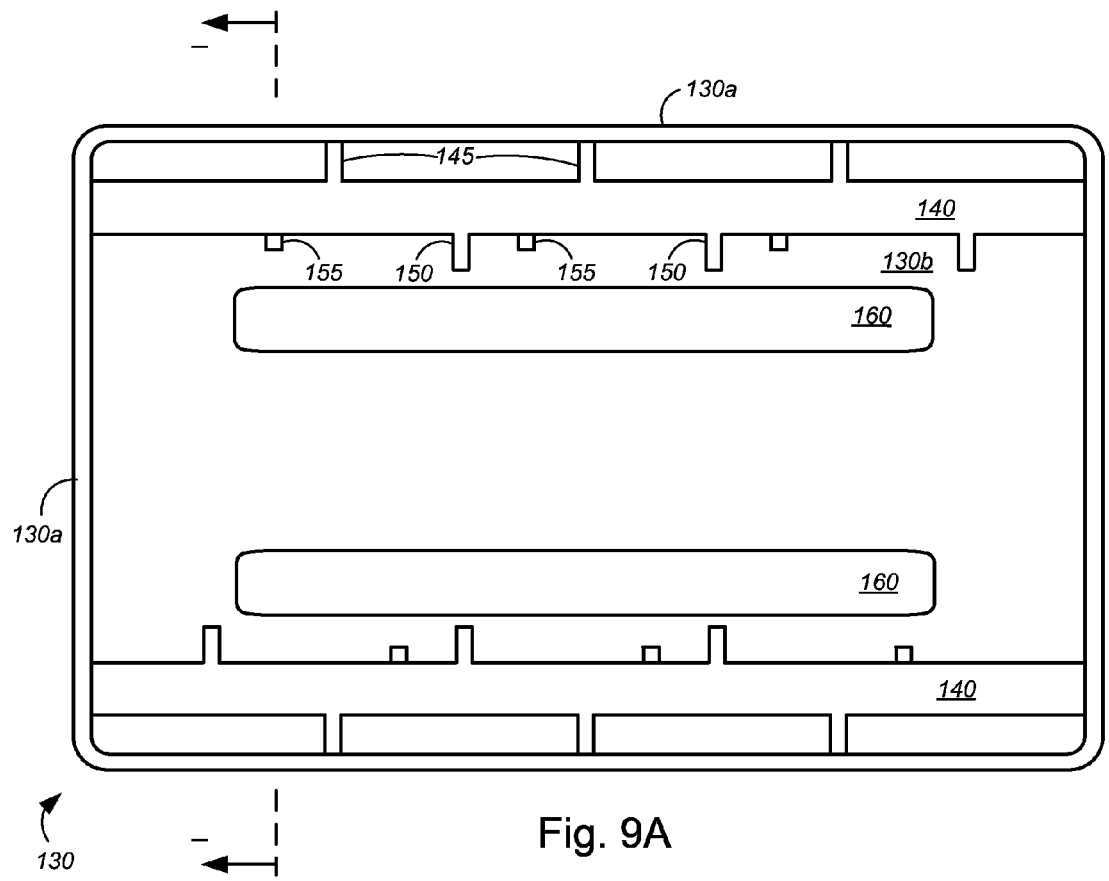
FIG. 9A is a front elevation view of an example of a housing for a portable electronic device, in accordance with various embodiments.
Figure 9B:
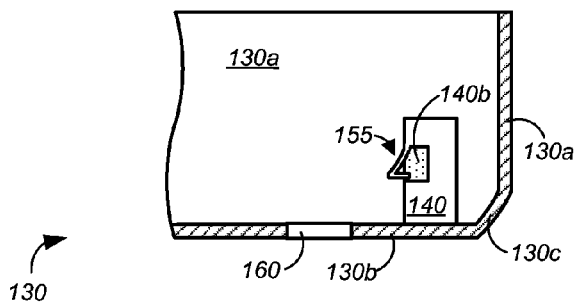
FIG. 9B is a partial sectional view of the housing, as shown along section line I-I in FIG. 9A, in accordance with various embodiments.

In the preceding figures, shock interface 140 is shown parallel with each of the four sidewalls 130a of housing 130. However, the various embodiments are not so limited. Shock interface 140 may comprise structures parallel to two opposing sidewalls 130a (rather than all sidewalls 130a), e.g., as shown in FIG. 9. FIG. 9A is a front elevation view of an example of a housing 130 for a portable electronic device 100, in accordance with various embodiments. FIG. 9B is a partial sectional view of the housing 130, as shown along section line I-I in FIG. 9A, in accordance with various embodiments. As shown in FIG. 9, shock interface 140 might comprise two portions, each parallel to a sidewall 130a, the two portions on opposite sides of housing 130. Each portion of shock interface 140 might comprise one or more support ribs 145, one or more alignment ribs 150, and one or more tabs 155 (that at least partially fit within cavities 140b). The form and structure of the overmold 135, front panel 105 (including camera 110, display 115, speaker 120, and buttons 125), additional electronics 175, and the chassis assembly (including chassis 165 and sub-chassis 170) might otherwise be similar to those as described above with respect to FIGS. 1-8.

In some embodiments, a single cover 160 (as shown, e.g., in the embodiments of FIGS. 3 and 4) may be used to cover access to an interior portion of housing 130. However, the various embodiments are not so limited. Multiple covers 160 may be provided in rear panel 130b to provide covered access to an interior portion of housing 130, particularly, to provide access to each of tabs 155 (such as to disengage 155 for releasing the chassis assembly as discussed above with respect to FIG. 5) or provide access to electronics housed within housing 130. In alternative embodiments, covers 160 may be omitted, while one or more side panels of housing 130 are configured to be engageably removable, as shown, e.g., in FIG. 10.

FIG. 10A is a front elevation view of an example of a housing 130 for a portable electronic device 100, in accordance with various embodiments. FIGS. 10B and 10C are partial sectional views of the housing 130 illustrating different positions of release mechanism 190, as shown along section line J-J in FIG. 10A, in accordance with various embodiments. In some embodiments, as shown, e.g., in FIG. 10, housing 130 might comprise one or more detachable sidewalls 130d. Detachable sidewalls 130d may comprise structures that are configured to engage with corresponding structures in shock interface 140, sidewalls 130c, rear panel 130b, and/or other portions of housing 130. Such structures might, in some examples, be similar to the notch/tab structures and/or the slot/rib structures, both as described above. For example, each removable sidewall 130d might comprise at least two walls 180 (similar to the middle wall of chassis 165). Like the middle wall of chassis 165, each wall 180 might comprise a notch 180a, which might engage with one of tabs 155" of shock interface 140, in a similar manner as described above with respect to tabs 155 and notches 165a.

For example, when a detachable sidewall 130d is slid into place in the housing 130 (i.e., in a direction parallel to the y-axis in FIG. 10A), so as to close the openings in the housing 130 caused by detached or removed sidewalls 130d, guides 130e—which might be affixed to an inner surface of sidewalls 130a and/or rear panel 130b, while extending beyond exposed edges of the housing 130 (as shown, e.g., in FIG. 10A)—might be used to ensure that detachable sidewall 130d is slotted appropriately (i.e., such as to be aligned) with respect to the remainder of the housing 130. Some embodiments may include a water-proof seal between sidewall 130a/rear panel 130b and detachable sidewall 130d (as understood by those skilled in the art), so as to prevent entry of any particulate matter and/or liquids into housing 130 through the interface between detachable sidewall 130d and the remainder of housing 130. Concurrent with guides 130e keeping sidewall 130d aligned with the remainder of housing 130, wall 180 might apply a force directed inward (i.e., along the y-axis direction) and/or in a direction into cavity 140c (i.e., along the x-axis direction), which might cause tabs 155" to bend inward into opening/cavity 140c within shock interface 140 (in a manner as discussed above). As tabs 155" encounter notches 180a in wall 180 (such as when sidewalls 130d and sidewalls 130a/rear panel 130b make contact with each other), the force ceases to be applied by wall 180, resulting in the tabs 155" returning to their original shape and position before encountering the force. As with tabs 155, a flat portion of each tab 155", which is generally parallel with at least an inner surface (i.e., surface that is closest to the interior of housing 130) of each notch 180a, might prevent the wall 180 (and the entire detachable sidewall 130d) from being removed from housing 130 (i.e., along the y-axis direction).

To remove detachable sidewall 130d from housing 130, e.g., tabs 155" might be disengage. In some embodiments, a tool, such as a screw driver or a custom tool, etc., might be used to apply the force discussed above. Such a tool, in some cases, might access the interior of housing 130 via cover 160 (not shown in FIG. 10, but shown in FIGS. 3, 4, and 9). In other embodiments, fixed structures (including, but not limited to, release mechanism 190 (and associated components)) may be utilized. According to some embodiments, detachable sidewalls 130d might further comprise one or more release mechanisms 190, which might be configured to apply the force necessary to disengage tab 155", without a user having to reach within housing 130 using a tool external to housing 130.

Release mechanism 190, in some cases, might include a track 185, a slider 190a, a striker 190b, a spring 195, and a spring retaining wall 195a. In some embodiments, slider 190a, a portion of which may be external to housing 130 (and configured to be actuated by a user's finger), might be configured to move along track 185. Some embodiments may include a water-proof (or water-resistant) seal between slider 190a and track 185, such that particulate matter and/or liquids may not enter housing 130 through release mechanism 190. Striker 190b might be mounted on slider 190a, so as to move together with slider 190a. Spring 195 might be positioned so as to be biased between striker 190b/slider 190a and a spring retaining wall 195a (which might be positioned close to shock interface 140). In some embodiments, one end of spring 195 might be affixed to one of striker 190b or slider 190a, while the other end of spring 195 might be affixed to retaining wall 195a. In alternative embodiments, the other end of spring 195 might be affixed to shock interface 140 directly, with retaining wall 195a omitted. In the stable state, spring 195 causes slider 190a/striker 190b to be at a position along the track 185 that is furthest from shock interface 140. When a user causes slider 190a to move toward shock interface 140—i.e., by pushing slider 190a against spring 195 using his or her finger—striker 190b (mounted on slider 190a) might be caused to move along the x-axis direction toward tab 155", to eventually pass through notch 180a, to apply a force against tab 155", in a direction into cavity 140c. When tab 155" is pushed into cavity 140c, detachable sidewall 130d might be able to be moved along the y-axis direction away from housing 130. In some embodiments, a user might hold slider 190a such that striker 190b holds tab 155" in cavity 140c while detachable sidewall 130d is being moved along the y-axis direction, until tab 155" is no longer in line with notch 180a (i.e., with a portion of wall 180 maintaining the x-axis directional force against tab 155"). With wall 180 holding tab 155" within cavity 140c, the user may release his or her hold on slider 190a, resulting in spring 195 pushing or resetting slider 190a to its rest or stable state within the track 185 (i.e., when spring 195 returns or expands to its uncompressed state).

Figure 11A:
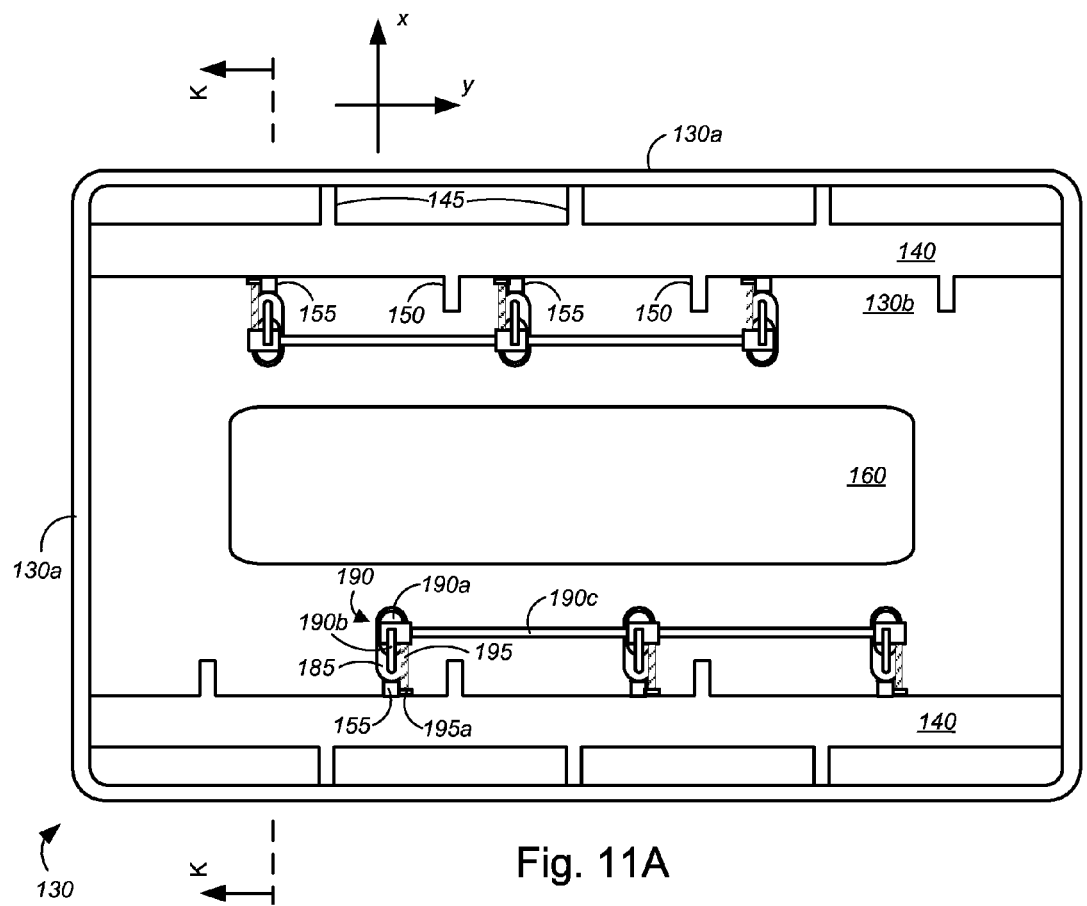
FIG. 11A is a front elevation view of an example of a housing for a portable electronic device, in accordance with various embodiments.
Figure 11B:
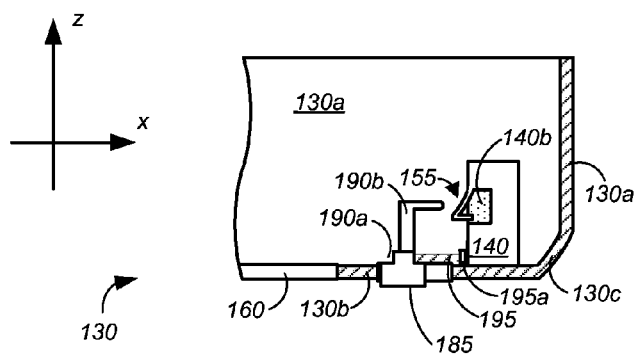
FIGS. 11B is a partial sectional view of the housing, as shown along section line K-K in FIG. 11A, in accordance with various embodiments.

FIG. 11A is a front elevation view of an example of a housing 130 for a portable electronic device 100, in accordance with various embodiments. FIGS. 11B is a partial sectional view of the housing 130 with release mechanisms 190, as shown along section line K-K in FIG. 11A, in accordance with various embodiments. As shown in FIG. 11, rather than using an external tool to disengage tabs 155 from notches 165a of the middle wall of chassis 165 when the chassis is engaged with the shock interface 140 (e.g., as shown in FIGS. 5-8), one or more release mechanisms 190 (similar to those shown in, and described with respect to, FIG. 10) might be provided within housing 130 to disengage tabs 155 from notches 165a. In some embodiments, each release mechanism 190 might comprise track 185, slider 190a configured to move along track 185, striker 190b mounted on slider 190a, spring retaining wall 195a, and spring 195 having one end affixed to retaining wall 195*a* and the other end affixed to one of striker 190*b* or slider 190*a*. Each release mechanism 190, in some embodiments, might be individually actuated to release each tab 155. In other embodiments, two or more release mechanisms 190 (each of which might comprise track 185, slider 190*a*, striker 190*b*, spring retaining wall 195*a*, and spring 195) might be linked, e.g., by connector 190*c*, such that actuation of one release mechanism 190 causes other release mechanisms 190—that are connected via connector 190*c* with the actuated release mechanism 190—to concurrently be actuated. Connected release mechanisms 190, in some embodiments, might comprise only one slider 190*a* that extends through a bottom portion of rear panel 130*b* for a user to actuate, while the other sliders 190*a* of the other connected release mechanisms 190 might only have an internal slider 190*a* that is inaccessible from outside housing 130 (except, perhaps, through cover 160 or through an opening left by removal of detachable sidewall 130*d*). In some cases, connected release mechanisms 190 might comprise only one spring 195 (and spring retaining wall 195*a*), i.e., for the actuated release mechanism 190, while the connected release mechanisms 190 might omit the spring 195 and retaining wall 195*a*.

To disengage the chassis assembly from shock interface 140 (and thus from housing 130), a user might use his or her finger to push slider 190*a* along track 185, against the spring force of spring 195, such that striker 190*b* pushes tab 155 (through notch 165*a*) into cavity 140*b*. At this point, the chassis assembly may be moved along the z-axis direction (e.g., by pushing up against the sub-chassis 170 through cover 160 or by lifting chassis assembly through a front opening of housing 130), while striker 190*b* holds tab 155 in cavity 140*b*, until movement of the chassis assembly is stopped by striker 190 against a lower inner surface of notch 165*a*. At this point, the middle wall of chassis 165 might align with a portion of tab 155, such that the middle wall holds tab 155 within cavity 140*b*. With the middle wall of chassis 165 holding tab 155 in place, the user may release his or her hold on slider 190*a*, resulting in the spring 195 expanding to its pre-compressed (i.e., stable) state, which pushes the slider 190*a* (together with striker 190*b*) along track 185 to its rest or stable state at the opposite end of track 185 (furthest from shock interface 140).

Although FIGS. 3-8 illustrate embodiments without any built-in release mechanisms, such embodiments may incorporate any of the examples of release mechanism 190 as shown in, and described with respect to, FIGS. 10 and 11. By the same token, any configuration of the cover(s) 160 as shown in the figures and described above may be implemented in any embodiment of the portable electronic device 100. Similarly, although one particular type of configuration of each of the tab/notch structure and the slot/rib structures is shown in the figures and described above, any configuration of the tab/notch structure (or equivalent engagement/locking structure) and any configuration of the slot/rib (or equivalent alignment structure) may be implemented in place of the specific examples as shown (which are merely exemplary and not intended to limit the scope of the embodiments).

For example, instead of the tab 155 structure as shown, a spring-loaded tab (which might, for example, have a flat base and a curved or angled wall) might be installed within cavity 140 together with a spring; in such a case, retaining structures on the spring-loaded tab and at the opening of cavity 140 might be provided to prevent the spring-loaded tab from being inadvertently expelled from cavity 140. The spring-loaded tab would otherwise function in a similar manner as tab 155.

In some embodiments, instead of the release mechanism 190 as shown and described, a spring-loaded flat plate (having a notch similar to notch 165*a*) might be provided that is configured to slide along tracks built into the shock interface 140, the spring-loaded flat plate being sandwiched between the middle wall of chassis 165 and the shock interface 140. The spring-loaded flat plate might be configured to be thin enough to allow tabs 155 to perform its function of securing chassis 165 in place, while being strong enough to resist easy breakage (i.e., by being made of metal, such as steel, aluminum, copper, etc., or of certain resilient plastics, etc.). Spring-loaded plate assembly, which might comprise the spring-loaded plate and the tracks, might further comprise a retaining wall that may be flush with a top surface 140*a* of shock interface 140, with one or more springs biased between (and affixed to each of) a bottom portion of the flat plate and the inner surface of rear panel 130*b*. The spring-loaded plate assembly may additionally comprise a pull-tab or other hand grip, or levered switch that is coupled to the flat plate through rear panel 130*b* (perhaps with appropriate water-proofing or particulate-resistant seals provided therewith). In operation, a user might cause the flat plate to move downward (along the track) against the spring force, e.g., by pulling on the hand grip situated external to the housing 130, such that a top portion of the notch engages tab 155, such that tab 155 might disengage from notch 165*a* of chassis 165.

In some embodiments, the levered switch might comprise a generally rectangular (or U-shaped) frame having a handle portion at one longitudinal end (or the flat/curved part of the U-shape), an attachment portion at the other end (or the tips of the U-shape), and a middle portion configured to be coupled with the flat plate via an interface material (which might be rigid or flexible, be part of the flat plate, or be separate from (yet affixed to) the flat plate) that extends through (the waterproof layer in) rear panel 130*b*. The attachment portion might be fixed in place in the exterior surface of rear panel 130*b*, such that pulling the handle portion might cause the levered switch to rotate about the attachment portion, thus causing the middle portion to pull on the interface material, which causes the flat plate to move downward against the spring, thereby engaging tab 155. In some cases, a track along an inward facing portion of the arms of the frame from the middle portion to the handle portion (or to a position close to the handle portion) may be provided along which an attachment mechanism of interface material (to the frame) might move as the frame is rotated; in such cases, the interface material might be configured to only be able to move in a direction substantially parallel to the z-axis direction.

Alternatively, the attachment portion might be fitted within a track in the surface of rear panel 130*b*, such that when the handle portion is pulled, the levered switch might rotate generally about the middle portion that is affixed to the interface material, with the attachment portion sliding along the track toward the a portion of the interface material that is pulled from within the housing 130; in such cases, the interface material might only be able to move in a direction substantially parallel to the z-axis direction. As the interface material is pulled from within the housing 130 (e.g., through the waterproof layer), the flat plate might be pulled downward to engage tab 155.

As with the connected release mechanisms 190 as shown in, and discussed with respect to, FIG. 11, any of the alternative release mechanisms discussed above (which might be otherwise individually actuated) may likewise be connected, such that actuating one might cause connected release mechanisms to concurrently be actuated.

Although a rib and slot interface system is described above (and shown in the various figures), the various embodiments are not so limited. Other alignment interfaces—including, but not limited to a post and hole interface system or a corner post and slot interface system, etc.—may be implemented. In a post and hole interface system, for example, posts on the chassis 165 might align with and fit within holes set in the shock interface 140 (or in raised blocks affixed to rear panel 130*b*). In a corner post and slot interface, in some examples, posts may be fitted into inner corners of a closed-loop shock interface 140 (e.g., as shown in FIG. 3) or into corners between shock interface 140 and sidewall 130*a* of housing 130 (facing an inner portion of housing 130), with appropriate slots located in the middle wall of chassis 165. The posts (and corresponding hole or slot) in either of these embodiments may be of any cross-sectional shape (including, but not limited to, circle, ellipse, square, rectangle, triangle, any polygon, any curved shape, or any combination of these shapes).

Although the embodiments as shown in, and described with respect to FIGS. 1-11, are generally configured so as to provide access to an inner portion of housing 130 (e.g., via cover 160, sidewalls 130*d*, etc.), with chassis 165 configured to be removably engaged with shock interface 140, the various embodiments are not so limited. In some embodiments, for example, the electronic device 100 may be intended to have an interior portion that is inaccessible to consumers. In such embodiments, cover 160, detachable sidewalls 130*d*, release mechanism 190, and associated components may be omitted, leaving an integral housing 130 together with chassis 165 and sub-chassis 170 fitted with overmold 135, which is supported on shock interface 140 (and support ribs 145) and aligned and connected to the shock interface 140 (via an alignment interface and connection interface, respectively), with front panel 105 (and additional electronics 175) fitted on the chassis 165 and/or sub-chassis 170, and with the overmold 135 forming a perimeter seal about the front panel 105.

While certain features and aspects have been described with respect to exemplary embodiments, one skilled in the art will recognize that numerous modifications are possible. For example, the methods and processes described herein may be implemented using hardware components. Further, while various methods and processes described herein may be described with respect to particular structural and/or functional components for ease of description, methods provided by various embodiments are not limited to any particular structural and/or functional architecture but instead can be implemented on any suitable hardware. Similarly, while certain functionality is ascribed to certain system components, unless the context dictates otherwise, this functionality can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with—or without—certain features for ease of description and to illustrate exemplary aspects of those embodiments, the various components and/or features described herein with respect to a particular embodiment can be substituted, added and/or subtracted from among other described embodiments, unless the context dictates otherwise. Consequently, although several exemplary embodiments are described above, it will be appreciated that the invention is intended to cover all modifications and equivalents within the scope of the following claims.

What is claimed is:

1. An electronic device, comprising:
   a housing defining an open front face;
   a chassis disposed within the housing, the chassis being in communication with the housing though a rib and slot interface, and the chassis being affixed to the housing with a tab and notch interface, both the rib and slot interface and the tab and notch interface defining a tolerance between the chassis and the housing in a vector substantially normal to the open front face;
   a panel disposed within the open front face of the housing and affixed to the chassis; and
   a deformable elastomer overmold surrounding a perimeter of the panel and disposed between at least a portion of the chassis and at least a portion of the housing, the overmold being configured to provide a perimeter seal around the panel and to deform upon a frontal impact to the panel, allowing compliance between the chassis and the housing to the extent of the tolerance;
   wherein the chassis comprises a lip around an outer perimeter thereof, wherein the deformable elastomer overmold includes a U-shaped structure configured to fit around the lip.

2. An electronic device, comprising:
   a housing defining an open front face;
   a panel disposed within the open front face of the housing;
   a first deformable overmold surrounding at least a portion of a perimeter of the panel and disposed between at least a portion of the panel and at least a portion of the housing, wherein the first deformable overmold is configured to provide a perimeter seal around the panel and to deform upon a frontal impact to at least one of the panel, the housing, or the first deformable overmold; and
   a chassis disposed within the housing, wherein the chassis is in communication with the housing though an alignment interface, the chassis being affixed to the housing with a connection interface, both the alignment interface and the connection interface defining a tolerance between the chassis and the housing in a vector substantially normal to the open front face, wherein the first deformable overmold is further disposed between at least a portion of the chassis and at least a portion of the housing, and further configured to deform upon the frontal impact to the at least one of the panel, the housing, or the first deformable overmold, while allowing compliance between the chassis and the housing to the extent of the tolerance;
   wherein the chassis comprises a lip around an outer perimeter thereof, wherein the first deformable overmold includes a U-shaped structure configured to fit around the lip.

3. The electronic device of claim 2, wherein the panel comprises at least one of a camera, display, speaker assembly, or physical buttons.

4. The electronic device of claim 3, wherein the display comprises at least one of a touch input display panel or a non-touch-input display panel.

5. The electronic device of claim 4, further comprising a second deformable overmold surrounding a perimeter of the display, and disposed between at least a portion of the display and at least a portion of the panel, the second deformable overmold being configured to provide a perimeter seal around the display and to deform upon a frontal impact to the display.

6. The electronic device of claim 2, wherein the first deformable overmold is made of a material selected from a group consisting of elastomer, rubber, and silicone.

7. The electronic device of claim 2, wherein the alignment interface comprises at least one of a plurality of rib and slot interfaces, a plurality of post and hole interfaces, or a plurality of corner post and slot interfaces.

8. The electronic device of claim 2, wherein the housing comprises a shock interface mounted on a rear panel of the housing, wherein the chassis comprises one or more connection walls configured to connect the chassis to the shock interface, wherein the connection interface comprises a tab and notch interface, the tab and notch interface comprising a plurality of tabs formed in cavities of the shock interface and a plurality of corresponding notches formed within the one or more connection walls of the chassis.

9. The electronic device of claim 8, wherein the shock interface comprises one or more support ribs extending between the shock interface and a sidewall of the housing, each of the one or more support ribs has a structure configured to support the first deformable overmold when the first deformable overmold is absorbing a force of the frontal impact to the panel.

10. The electronic device of claim 9, wherein the lip of the chassis extends into the housing along a direction parallel to the vector, wherein the U-shaped structure comprises an outer wall, an inner wall, and a base, wherein the outer wall is disposed between the lip and the housing, the inner wall and the outer wall sandwich the lip, and the base is disposed between the lip and the one or more support ribs.

11. The electronic device of claim 8, wherein the housing comprises one or more release mechanisms, each corresponding to one of the plurality of tabs, wherein the one or more release mechanisms comprise structural components configured to disengage the plurality of tabs from the plurality of notches, allowing the chassis to be disengaged from the housing.

12. The electronic device of claim 11, wherein the one or more release mechanisms comprises at least one of a plurality of striker release systems or a plurality of plate release systems.

13. The electronic device of claim 12, wherein each of the plurality of striker release systems comprises a track formed in the rear panel of the housing, a slider configured to move along the track and having a portion accessible from an external portion of the housing, a striker mounted to the slider configured to actuate one of the plurality of tabs when the slider is moved from a first position in the track to a second position in the track, and a spring biased between the slider and a retaining wall, wherein said spring, when unbiased, returns the slider to the first position from the second position, wherein the retaining wall includes one of an inner wall of the shock interface and a retaining block mounted to an inner surface of the rear panel of the housing.

14. The electronic device of claim 12, wherein each of the plurality of plate release systems comprises a track formed in an inner wall of the shock interface, a retaining block formed near a top surface of the shock interface at one end of the track, a thin rigid plate configured to fit within and move along the track between the retaining block and the rear panel of the housing, a spring biased between and affixed to each of the thin rigid plate and the rear panel, wherein the thin rigid plate comprises a plate notch formed therein corresponding to a position of one of the plurality of tabs when the thin rigid plate is positioned in a first position, wherein an upper inner wall of the plate notch is configured to actuate said one of the plurality of tabs when the thin rigid plate is moved from the first position in the track to a second position in the track, and wherein said spring, when unbiased, returns the thin rigid plate to the first position from the second position.

15. The electronic device of claim 12, wherein the one or more release mechanisms further comprises one or more connectors affixed to at least two of the one or more release mechanisms, such that actuation of one release mechanism simultaneously actuates each connected release mechanism.

16. The electronic device of claim 2, wherein the housing comprises at least one of:
   four or more sidewalls, and wherein at least one sidewall of the housing is replaceably detachable from the housing; or
   a rear panel having at least one opening therein and an access cover corresponding to each of the at least one opening that removably seals the at least one opening.

17. A protective housing for providing impact, water, and particulate protection for an electronic device, the protective housing comprising:
   a housing defining an open front face;
   a chassis disposed within the housing, wherein the chassis supports the electronic device thereon, the electronic device being disposed within the open front face of the housing; and
   an overmold surrounding at least a portion of a perimeter of the electronic device and disposed between at least a portion of the chassis and at least a portion of the housing;
   wherein the chassis comprises a lip around an outer perimeter thereof, wherein the overmold includes a U-shaped structure configured to fit around the lip.

* * * * *